(12) United States Patent
Eva et al.

(10) Patent No.: US 8,891,172 B2
(45) Date of Patent: Nov. 18, 2014

(54) OPTICAL ELEMENT AND METHOD

(75) Inventors: Eric Eva, Aalen (DE); Payam Tayebati, Ulm (DE); Michael Thier, Moegglingen (DE); Markus Hauf, Ulm (DE); Ulrich Schoenhoff, Ulm (DE); Ole Fluegge, Bartholomac (DE); Arif Kazi, Aalen (DE); Alexander Sauerhoefer, Hamburg (DE); Gerhard Focht, Wilmsdorf (DE); Jochen Weber, Heidenheim-Grosskuchen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/402,015

(22) Filed: Mar. 11, 2009

(65) Prior Publication Data

US 2009/0257032 A1    Oct. 15, 2009

Related U.S. Application Data

(63) Continuation of application No. PCT/EP2007/008266, filed on Sep. 21, 2007.

(30) Foreign Application Priority Data

Sep. 21, 2006  (DE) .......................... 10 2006 045 075

(51) Int. Cl.
*G02B 9/00* (2006.01)
*G03F 7/20* (2006.01)
*G02B 27/00* (2006.01)
*G02B 7/02* (2006.01)

(52) U.S. Cl.
CPC ........ *G03F 7/70891* (2013.01); *G02B 27/0068* (2013.01); *G03F 7/70266* (2013.01); *G02B 7/028* (2013.01)
USPC .......................................................... 359/649

(58) Field of Classification Search
USPC .................................................. 359/649–651
See application file for complete search history.

(56) References Cited

U.S. PATENT DOCUMENTS

| 3,904,274 | A | | 9/1975 | Feinleib et al. |
| 4,730,900 | A | | 3/1988 | Uehara et al. |
| 4,773,748 | A | | 9/1988 | Shih et al. |
| 4,784,476 | A | * | 11/1988 | Schulman et al. ............ 359/245 |
| 4,848,881 | A | | 7/1989 | Kahan et al. |

(Continued)

FOREIGN PATENT DOCUMENTS

| DE | 40 42 259 | 6/1992 |
| DE | 198 24 030 | 12/1999 |

(Continued)

OTHER PUBLICATIONS

Hecht, Eugene, Optics, second edition, sections 10.1 and 10.1.1, May 1990.*

(Continued)

*Primary Examiner* — Jordan Schwartz
(74) *Attorney, Agent, or Firm* — Fish & Richardson P.C.

(57) ABSTRACT

The disclosure relates to an optical element configure to at least partial spatially resolve correction of a wavefront aberration of an optical system (e.g., a projection exposure apparatus for microlithography) to which optical radiation can be applied, as well as related systems and methods.

7 Claims, 17 Drawing Sheets

(56) References Cited

U.S. PATENT DOCUMENTS

| | | | |
|---|---|---|---|
| 4,872,743 A | 10/1989 | Baba et al. | |
| 5,036,317 A * | 7/1991 | Buzak | 345/74.1 |
| 5,359,444 A * | 10/1994 | Piosenka et al. | 349/13 |
| 5,386,427 A | 1/1995 | Zayhowski | |
| 5,390,228 A | 2/1995 | Niibe et al. | |
| 6,041,149 A * | 3/2000 | Monte | 385/2 |
| 6,081,388 A | 6/2000 | Widl | |
| 6,198,579 B1 | 3/2001 | Rupp | |
| 6,307,688 B1 | 10/2001 | Merz et al. | |
| 6,466,382 B2 | 10/2002 | Müller-Rissmann et al. | |
| 6,521,877 B1 | 2/2003 | Müller-Rissmann et al. | |
| 6,600,606 B2 | 7/2003 | Sekine | |
| 6,690,500 B2 * | 2/2004 | Ogasawara et al. | 359/245 |
| 7,019,888 B1 | 3/2006 | Graves et al. | |
| 7,064,885 B1 | 6/2006 | Winzer | |
| 7,177,007 B2 | 2/2007 | Emoto | |
| 7,525,640 B2 | 4/2009 | Jansen et al. | |
| 2001/0006429 A1 | 7/2001 | Wals et al. | |
| 2001/0038446 A1 | 11/2001 | Takahashi | |
| 2002/0008911 A1 | 1/2002 | Sekine | |
| 2002/0048096 A1 | 4/2002 | Melzer et al. | |
| 2003/0021040 A1 | 1/2003 | Epple et al. | |
| 2003/0043462 A1 | 3/2003 | Sekine | |
| 2005/0042153 A1 * | 2/2005 | Bristol et al. | 422/186.3 |
| 2005/0146701 A1 | 7/2005 | Holderer et al. | |
| 2005/0231677 A1 | 10/2005 | Meredith | |
| 2005/0275497 A1 * | 12/2005 | Ramadan et al. | 336/200 |
| 2006/0050402 A1 | 3/2006 | Ho et al. | |
| 2006/0256419 A1 | 11/2006 | Graf et al. | |
| 2007/0019305 A1 | 1/2007 | Ulrich et al. | |
| 2007/0222013 A1 * | 9/2007 | Lincoln et al. | 257/431 |
| 2008/0106711 A1 | 5/2008 | Beierl et al. | |
| 2008/0123066 A1 * | 5/2008 | Jansen et al. | 355/30 |
| 2009/0015785 A1 * | 1/2009 | Blum et al. | 351/159 |
| 2010/0201958 A1 | 8/2010 | Hauf et al. | |
| 2011/0080569 A1 | 4/2011 | Eva et al. | |

FOREIGN PATENT DOCUMENTS

| | | |
|---|---|---|
| DE | 198 27 602 | 12/1999 |
| DE | 198 59 634 | 6/2000 |
| DE | 10 2005 062 401 | 6/2007 |
| EP | 0 660 169 | 6/1995 |
| EP | 0 678 768 | 2/1996 |
| EP | 0 851 304 | 7/1998 |
| EP | 1 103 857 | 5/2001 |
| EP | 1 191 377 | 3/2002 |
| EP | 1 243 970 A1 * | 9/2002 |
| EP | 1 376 185 | 1/2004 |
| EP | 1 376 192 | 1/2004 |
| JP | 60-36622 | 3/1985 |
| JP | 60-079357 | 5/1985 |
| JP | 04-142727 | 5/1992 |
| JP | 9-232213 | 9/1997 |
| JP | 2000-114143 | 4/2000 |
| JP | 2001-013297 | 1/2001 |
| JP | 2001-185483 | 7/2001 |
| JP | 2001-264626 | 9/2001 |
| JP | 2004-039862 | 2/2004 |
| JP | 2004-246343 | 9/2004 |
| JP | 2005-019628 | 1/2005 |
| JP | 2005-268015 | 9/2005 |
| JP | 2007-524106 | 8/2007 |
| JP | 2010-504631 | 2/2010 |
| KR | 2001-0070228 | 7/2001 |
| WO | WO 93/01513 | 1/1993 |
| WO | WO 03/075096 | 9/2003 |
| WO | WO 2004/036316 | 4/2004 |
| WO | WO 2005/069055 | 7/2005 |
| WO | WO 2006/025408 | 3/2006 |
| WO | WO 2006/079537 | 8/2006 |
| WO | WO 2006/128613 | 12/2006 |
| WO | WO 2008/034636 | 3/2008 |

OTHER PUBLICATIONS

Japanese Office Action, with English translation, for counterpart JP Appl. No. 2010-521317, dated Jun. 26, 2012.

Japanese Office Action, with English translation, for corresponding JP Appl No. 2009-528651, dated Oct. 9, 2012.

Korean Office Action, with translation thereof, for corresponding KR Appl No. 10-2009-7008082, dated Feb. 3, 2014.

* cited by examiner

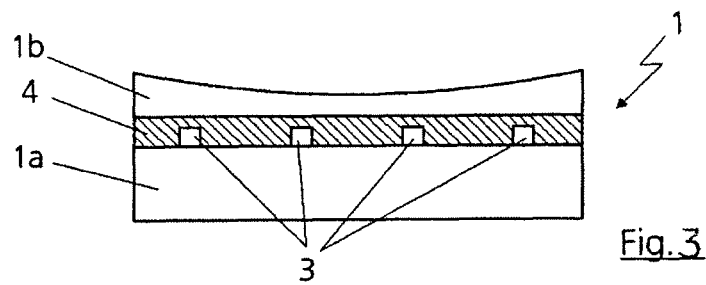
Fig. 3
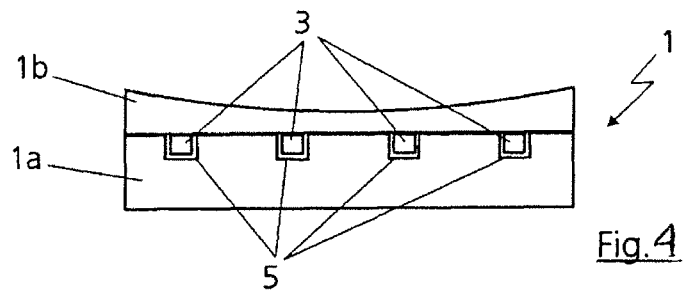
Fig. 4
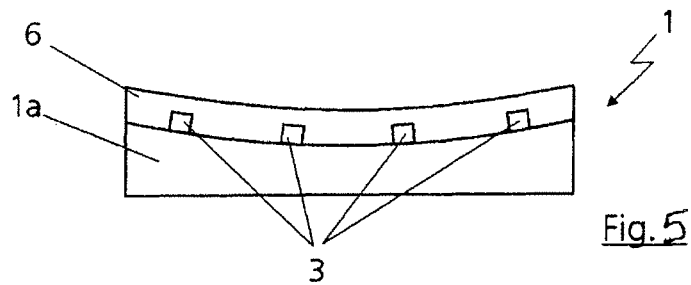
Fig. 5
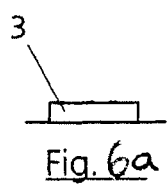 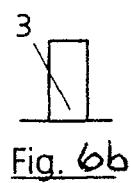 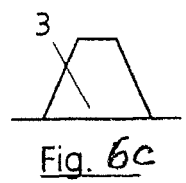 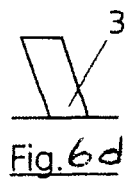
Fig. 6a   Fig. 6b   Fig. 6c   Fig. 6d

OPTICAL ELEMENT AND METHOD

CROSS-REFERENCE TO RELATED APPLICATIONS

This application is a continuation of, and claims benefit under 35 USC 120 to, international application PCT/EP2007/008266, filed Sep. 21, 2007, which claims benefit of German Application No. 10 2006 045 075.2, filed Sep. 21, 2006. International application PCT/EP2007/008266 is hereby incorporated by reference.

FIELD

The disclosure relates to an optical element configure to at least partial spatially resolve correction of a wavefront aberration of an optical system (e.g., a projection exposure apparatus for microlithography) to which optical radiation can be applied, as well as related systems and methods.

BACKGROUND

In modern projection objectives for microlithography, a multiplicity of wavefront manipulators are often used for correcting optical aberrations. Most of the manipulators can bring about a wavefront correction via mechanical manipulation of optical elements. This takes place either via position change and/or via a deformation of the optical elements. The manipulators often have correction properties for low-order wavefront aberrations such as typically occur when using the objectives in conjunction with so-called conventional settings and at a throughput of approximately 120 wafers/hour.

SUMMARY

In some embodiments, the disclosure provides a method for correcting projection exposure apparatuses for microlithography with regard to their imaging aberrations, wherein temporally variable imaging aberrations and/or azimuthally and/or radially higher-order imaging aberrations are deemed to be relevant. In certain embodiments, the disclosure provides an optical element and also a method that permits an electromagnetic radiation incident on the optical element to be influenced temporally and spatially locally. Furthermore, in some embodiments the disclosure provides a projection exposure apparatus or a projection objective for semiconductor lithography which can be dynamically corrected with regard to possible imaging aberrations. Moreover, in certain embodiments, the disclosure provides a method for operating a projection exposure apparatus or a projection objective for semiconductor lithography which permits a spatially and temporally highly resolved correction of imaging aberrations.

In some embodiments, the disclosure advantageously involves providing an optical element having a temperature profile that can be set freely. This can involve the capability of being able to heat to the element at any location. However, the desired properties of the optical performance of the projection objectives often involve very stringent restrictions with regard to the optically active elements that are permitted to be positioned in the beam path. A maximum permitted homogeneous area coverage (a shading of the beam path) of a few thousandths in terms of order of magnitude can result for elements near the pupil. The restrictions can be even more stringent for elements near the field. The use of fluid-mechanical heat pumps is thus generally precluded.

The optical element has at least one electrical conductor track, and the optical action of the optical element is capable of being influenced via the electrical conductor track.

The optical thickness of the optical element can be varied via the temperature dependence of the optical refractive index of the optical element. The phase variation $\Delta\phi$ is approximately proportional to the heated distance traversed in the optical element $\Delta Z$, the temperature sensitivity of the optical refractive index $dn/dT$ and the temperature variation $\Delta T$ $$\Delta\varphi = \Delta Z \frac{dn}{dT} \Delta T$$

For a given geometry of the optical element, the phase change is thus approximately proportional to the temperature change. An optical wavefront that passes through an optical element therefore experiences a wavefront deformation corresponding to the temperature profile of the optical element. Conversely, a deformed wavefront can be corrected via a suitable inverse temperature profile. Within the very small temperature range of from typically less than 1 kelvin to a few kelvin, the temperature change of the refractive index can be assumed to be constant over the temperature. For quartz glass, a sensitivity of approximately 0.002/1 mK results, for example, that is to say that a phase effect of 400 nm can be produced with 1 K temperature swing for a glass thickness of 20 mm.

This is sufficient for correction of the typical amplitudes of high-order wavefront aberrations in projection objectives for microlithography.

In addition to the refractive index change, the thermally governed expansion of the optical element is also relevant to the alteration of the optical action of the optical element. In this case, this phase variation $\Delta\phi'$ is spatially locally approximately proportional to the jump in the refractive index at the boundary of the optical element $\Delta n$, the expansion sensitivity or the coefficient of thermal expansion (CTE) of the optical element $dZ/dT$ and the temperature variation $\Delta T$ $$\Delta\varphi \approx \Delta n \frac{dZ}{dT} \Delta T$$

Depending on the arrangement of the conductor track in the optical element, the proportions of the effects from the change in the refractive index of the optical element and the form variation of an optically active area of the optical element vary in this case. Only the latter takes effect naturally in the case of mirrors.

If, therefore, a conductor track is used for temperature regulation, then it can be advantageous, on account of the shading issue already outlined, for conductor track to have a cross section of less than 50 µm at least in sections orthogonal to the direction of incidence of the optical radiation so that the conductor track does not inherently impair the optical action of the optical element. It can also be advantageous to ensure the spatially free adjustability of the temperature in the optical element by a sufficient density of the conductor tracks. Distances between the conductor tracks which ensure a lateral resolution of the wavefront aberration of 10-15 percent of the pupil diameter are advantageous.

Depending on the position of the optical element in the imaging system in which it is employed, conductor track widths smaller than 50 µm can also be advantageous. In the case of a position in the region of a pupil plane of a projection objective for semiconductor lithography, a width of approximately 1 µm, in particular, are extremely advantageous. This can have the effect that, on account of the comparatively small diameter of the conductor track, an impairment of the functionality of the optical element is largely avoided or even precluded, and that in the case of a suitable spatial distribution of the conductor track, only a small proportion of the optically active proportion of the optical element is affected by the shading.

Using methods of extremely fine conductor etching from printed circuit board production, lithography, electron beam lithography or via laser microstructuring, it is possible to produce the conductor tracks down to a minimum width of approximately 0.5 µm down to 10 nm.

In order to avoid a negative influence of the conductor tracks per se on the optical action of the optical element, it is desired to limit not only the diameter of the conductor tracks but also the shading caused overall by the conductor tracks in the optical element.

In the case of the application of the disclosure to optical elements used in a projection objective for semiconductor lithography, the following estimation can be made: bubble classes up to 5×0.25 for example may be permitted depending on the position of the optical element in the objective. This corresponds to a total area of 1.25 mm$^2$. According to ISO 1010-3 it is permitted for this area to be distributed between more bubbles of an equivalent total area as long as no clustering occurs in this case. To a first approximation it would therefore be permissible to distribute a conductor track having a length of up to 1.25 m and a width of 1 µm over the optical element. If appropriate, it can be ensured by virtue of irregularities in the distribution or the width and the cross-sectional form of the conductor track that systematic effects such as e.g. influencing of specific diffraction orders or a directional scattered light do not occur.

The disclosure is suitable in particular for an application in the region of lenses or plane plates through which radiation is transmitted; however, a use on or else behind the reflective surface of a mirror is likewise conceivable, too. A use in beam splitters including a refractive part and a reflective part is likewise conceivable. The optical action induced by the heat input corresponds, in all cases with occurrence of a first region of the optical element, through which light passes, and a second region of the optical element, which reflects the light, to the superposition of the above-described effects on the refractive index and the form variation of the optical element.

Via the at least one electrically conductive conductor track arranged optionally in distributed fashion in the region of an optically active optical area of the optical element according to the disclosure, the optical element can advantageously be heated locally in the vicinity of the optically active area via electrical power, e.g. by a few millikelvin, such that the optically active area can be altered in a controllable manner with regard to its form or other parameters on account of the heat input. It is thus possible to control the optical action of the optical element by the electrical power input by the electrically conductive conductor track. This can be used to dynamically correct higher-order imaging aberrations in an optical imaging system such as e.g. a projection exposure apparatus. Through the possible use of the correction element in transmission it is possible to correct imaging aberrations of higher radial and/or azimuthal order at any desired positions in an optical imaging system, that is to say in particular also at positions at which no locally deformable mirrors are provided, for example therefore also in purely refractive optical imaging systems.

The wavelength range of the electromagnetic radiation incident on the optical element optionally lies in the optical range through to the extreme ultraviolet range (EUV), that is to say in a spectral range of approximately 10 nm-approximately 1 µm. However, the optical element can also be applied to electromagnetic radiation which exceeds the wavelength range of 1 µm, such as e.g. in the infrared and far infrared range through to 10 µm.

The at least one electrically conductive conductor track arranged optionally in distributed fashion in the optical element can be arranged both on an optically active area of the optical element and below an optically active area within the optical element. The electrically conductive conductor track of the optical element furthermore includes connection elements for electrically driving the conductor track.

The optical element permits supervision of the wavefront of the electromagnetic radiation with a spatial resolution similar to that when using correction aspheres produced via ion beam figuring, although in contrast to the conventional procedure the setting can be changed dynamically within a few seconds.

The complicated production and integration of the above-mentioned correction aspheres can be replaced by the use of previously calculated static heating profiles. Various preprogrammed correction actions can likewise be "switched in" dynamically, which can serve for improving the resolution in specific applications. Correction profiles which are calculated in advance or derived from measurement data can in this case correct imaging aberrations on account of compaction/rarefaction (i.e. local changes in the density of the material of the optical element), strained holders of the optical elements or surface deformations of the optical element. In interaction with information from a control computer about the present operating mode of the system in which the optical element is used, local changes in density and form on account of the heating of the optical element can also be compensated for dynamically. Furthermore, an automatic feedback loop in which data from wavefront sensors are used directly for deriving the desired heating profile is also conceivable.

In some embodiments, the optical element has an at least partly transparent and/or reflective active optical area. In this case, the optical element can be formed as a beam splitter cube, beam splitter plate, plane-parallel plate, wedge plate or generally as a refractive optical element (ROE). Optionally, the optical element is formed as a lens, e.g. as a converging lens, diverging lens, Fresnel lens or Fresnel zone plate.

The optical element can also be an at least partly reflective element, e.g. a beam splitter device. In the case of such optical elements, the reflectively coated area can be arranged on the input side of the optical element for the useful light beam path or on the output side thereof. The heating of the optical element correspondingly affects the surface form of the input side or, in the other case, the surface form of the output side and also the refractive index of the optical element. Furthermore, the optical element can be realized as a diffractive optical element, such as e.g. in the form of a reflection or transmission grating. The optical element can furthermore also be realized as a combined element including refractive, reflective and/or diffractive structures.

The at least one conductor track of the optical element can have a diameter or a cross-sectional dimension of less than 50 µm at least in sections; optionally, the diameter or the cross-sectional dimension lies between 50 nm and 1 µm.

BRIEF DESCRIPTION OF THE DRAWINGS

FIG. 3 shows an optical element constructed in two parts;

FIG. 4 shows a variant of the disclosure;

FIG. 5 shows conductor tracks applied to the finished polished surface of a substrate;

FIGS. 6a-6d show cross-sectional profiles of conductor tracks;

DETAILED DESCRIPTION

Figure 1:
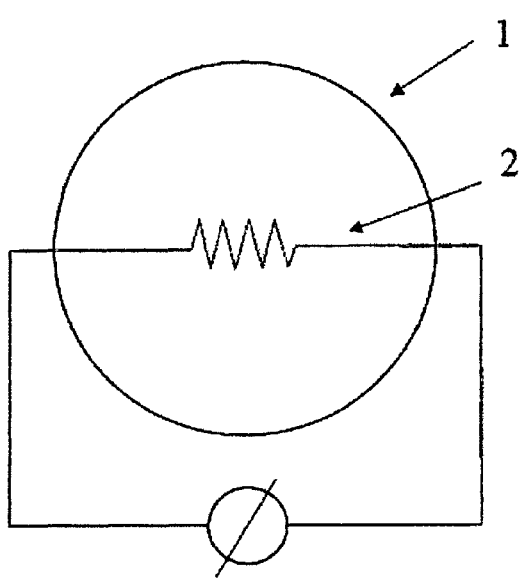
FIG. 1 shows an illustration of the fundamental principle of the disclosure

FIG. 1 illustrates the general approach of the disclosure. An optical element 1 including a substrate is equipped with an electrically drivable conductor track 3, which forms an ohmic resistance in the optical element. If a voltage is applied to the conductor track, then a current flows that heats the ohmic resistance. The coiling of the conductor track permits a spatial localization of the heating.

Figure 2:
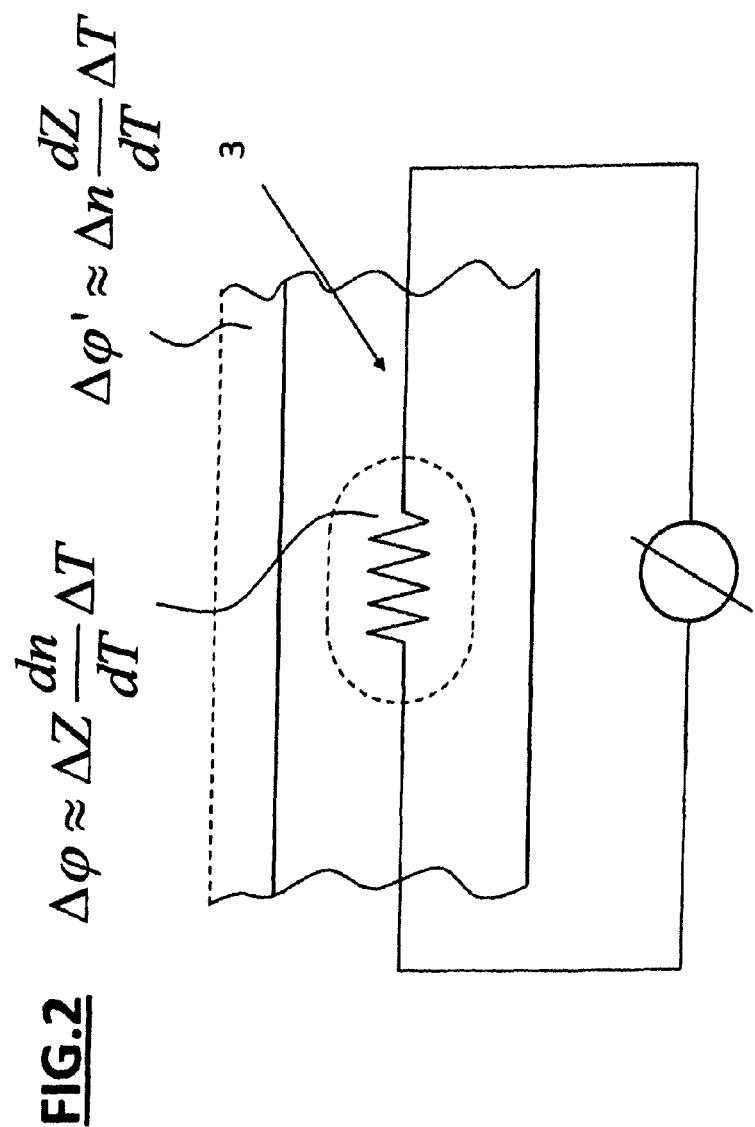
FIG. 2 shows an illustration of the influence of the heat input on an optical element

FIG. 2 illustrates the two effects of the heating on the optical element 1. Since these two effects are of spatially local nature, only an excerpt from the optical element 1 is illustrated in FIG. 4. The first of the two effects is the effect on the refractive index $$\Delta\varphi \approx \Delta Z \frac{dn}{dT} \Delta T$$

of the optical element. The second effect is that of an expansion and the associated form variation $$\Delta\varphi' \approx \Delta n \frac{dn}{dT} \Delta T$$

of the optical element.

FIG. 3 shows, as a variant, an optical element 1 constructed in two parts from a first substrate 1a and a second substrate 1b. In this case, the conductor tracks 3 are arranged between the two substrates. The second substrate 1b is connected to the first substrate 1a via a thin cement layer 4; in this case, the cement layer 4 also serves to compensate for the height difference caused by the conductor tracks 3 on the surface of the first substrate 1a. The optical element 1 can be, in particular, a lens, a mirror, a beam splitter device or else an optical element having a diffractive structure.

It is also possible for the optical element to be formed from one substrate, and for the conductor tracks to be situated in the region of a surface of this optical element.

FIG. 4 shows a variant in which the conductor tracks 3 are arranged in cutouts 5. In this case, the cutouts 5 may have been produced via an etching method, in particular. This variant has the advantage that the first substrate 1a can be connected to the second substrate 1b without the use of a cement layer. Thus, by way of example, the second substrate 1b can be connected to the first substrate 1a by wringing.

FIG. 5 shows an embodiment of the disclosure whose realization is associated with little outlay. In this case, the conductor tracks 3 are arranged on the polished surface of the substrate 1a. The substrate 1a and also the conductor tracks 3 are covered by the optical layer 6. The optical layer 6 can be, for example, an antireflection layer or else—in the case where a mirror is used as optical element 1—a highly reflective layer. In order to produce the embodiment from FIG. 5, the optical layer 6 is applied to the substrate 1a already provided with conductor tracks 3; it covers the optical surface of the substrate 1a and the conductor tracks 3. Depending on the production process for the optical layer 6, the optical layer 6 can be elevated after its application in the region of the conductor tracks and be levelled there via a polishing step subsequent to its application.

There are various possibilities for the configuration of the cross sections of the conductor tracks 3, some of which are illustrated in FIG. 6. Etched or vapour-deposited conductor tracks 3 are usually flat, as illustrated in FIG. 6a. In order to reduce the optically active cross section, however, a profile of the conductor track 3 in which the conductor track 3 is higher than it is wide can also be chosen for a given resistance value; this case is illustrated in FIG. 6b. For the cases in which the beam path is divergent at the relevant location of the optical element 1, a trapezoidal cross section of the conductor tracks 3 can also be chosen, as outlined in FIG. 6c. For regions at the edge of the optical element 1 where the optical radiation is incident predominantly obliquely, the profile of the conductor tracks 3 can be formed in a manner inclined towards the centre of the optical element 1, as illustrated in FIG. 6d. Moreover, it is conceivable for the edges and corners of the profile of the conductor track 3 to be configured in rounded or irregular fashion, whereby scattering can be reduced or smeared over wide angular ranges.

In this case, the electrical conductor tracks can have a cross section of at most 1 or between 0.5 and 0.01 micrometer at least in sections laterally with respect to the direction of incidence of the optical radiation. The spacing apart of the conductor tracks is between 0.01 and 1 millimeter. Spacings of between 0.05 and 0.5 millimeter are also possible, such as a spacing of 0.1 millimeter.

FIG. 7 shows, in subfigures 7a and 7b, cases in which regions of high heat power densities are imaged. Here the case of FIG. 7a relates to an application of heat which is assumed to be perpendicular in the plane of the drawing and is not illustrated and is caused by a dipole in the case where the optical element 1 is used in a projection exposure apparatus for microlithography. In the case illustrated in FIG. 7a, the conductor tracks 3 are concentrated on the region complementary to the region to which the optical radiation is applied. An at least partial homogenization of the total heat input is thereby achieved. FIG. 7a likewise illustrates the connecting wires 7 used to make contact with the conductor tracks 3 arranged in the optical element 1. FIG. 7b shows a variant for a position, near the field, of the optical element with an embodiment of the heating zone in accordance with the field in the form of the scanner slot. In this case, the optical element 1 is arranged in a region of the projection objective near the field. The conductor tracks 3 and the connecting wires 7 in the optical element 1 are illustrated here, too. For the case where the conductor tracks 3 are used as heating wires, the density of the heating of the optical element 1 can be varied by varying the splitting of the conductor tracks 3 or the coiling thereof as illustrated in FIG. 7a and FIG. 7b. In this case, the coiling may be a lateral variation in the sense of a lateral zig zag course of the conductor tracks 3; furthermore, it is also conceivable for the coiling to be formed three-dimensionally, for example in the manner of a helical spring.

Figure 7A:
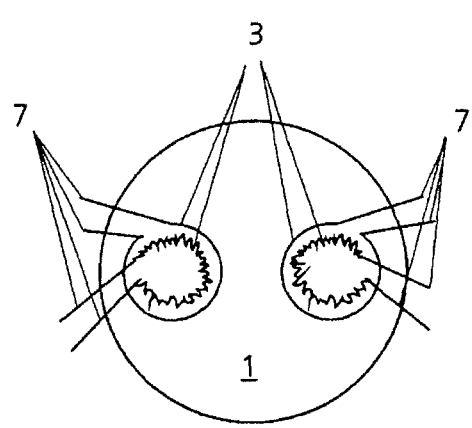
FIGS. 7a and 7b show regions having high heat power densities are simulated.
Figure 7B:
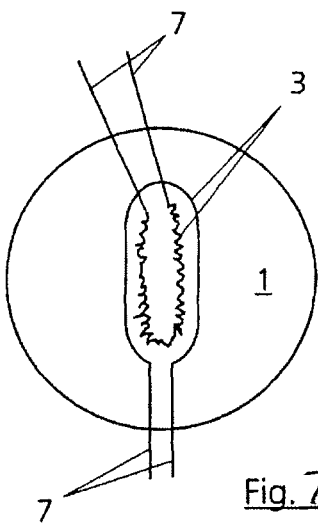

A further variant of the disclosure, in FIG. 7a and FIG. 7b, assumes an identical azimuthal orientation of the heat input of the optical radiation and the heat input of the conductor tracks. In this case, the substrate of the optical element provided with the conductor tracks has an opposite sign of dn/dT to the optical element or optical elements that substantially take up the heat input caused by the optical radiation. Possible pairings here are quartz glass and $CaF_2$, or vice versa.

Figure 8:
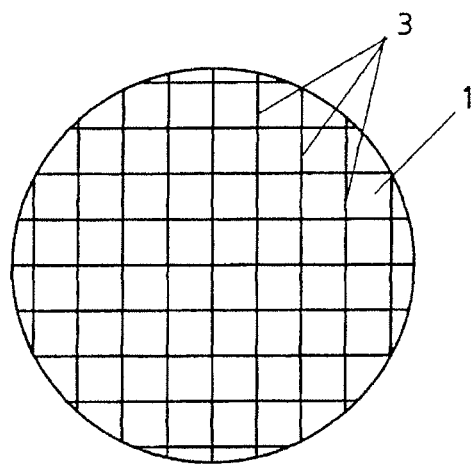
FIG. 8 shows the arrangement of conductor tracks in a matrix structure.

FIG. 8 shows an optical element 1 in plan view on which the conductor tracks 3 are arranged in the manner of a matrix. The horizontal and the vertical conductor tracks are connected via heating resistors or coils (not illustrated here). This variant of the disclosure, by virtue of in each case separate contact-connection of the conductor tracks 3, affords the possibility of heating locally at the crossover points of the conductor tracks 3. The arrangement of the conductor tracks that is shown in FIG. 8 opens up the possibility of compensating for strip-type variations in the constitution of the material used for the optical element such as can occur at individual manufacturers. An offset of the conductor tracks in a direction out of the plane of the drawing is naturally involved in order to be able to drive all the crossover points individually. However, a coupling of individual conductor tracks may also be advantageous in the case of previously known symmetry properties of the heating of the optical element that is brought about by the optical radiation. The voltage applied to the individual conductor tracks can additionally be driven in pulsed fashion.

Figure 9:
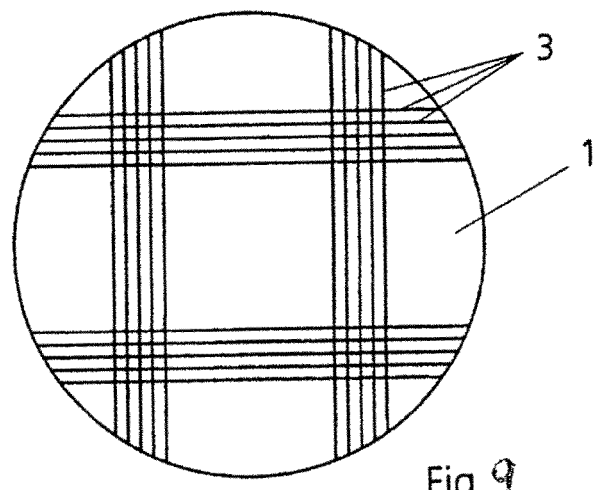
FIG. 9 shows a matrix structure with non-equidistant conductor tracks.

FIG. 9 shows, likewise in plan view, the case where the conductor tracks 3 are not arranged equidistantly in the matrix structure across the optical element 1. The individual conductor tracks are connected here once again via heating resistors or coils (not illustrated). This embodiment of the disclosure is suitable particularly for compensating for the effects of quadrupole illumination settings in the case where the optical element 1 is used in a projection exposure apparatus for semiconductor lithography. Statements analogous to those made in the context of the dipole illumination discussed above are applicable for the desired relative geometrical position of the heat inputs as a result of the optical radiation and that of the heating wires or heating resistors with respect to one another.

Figure 10:
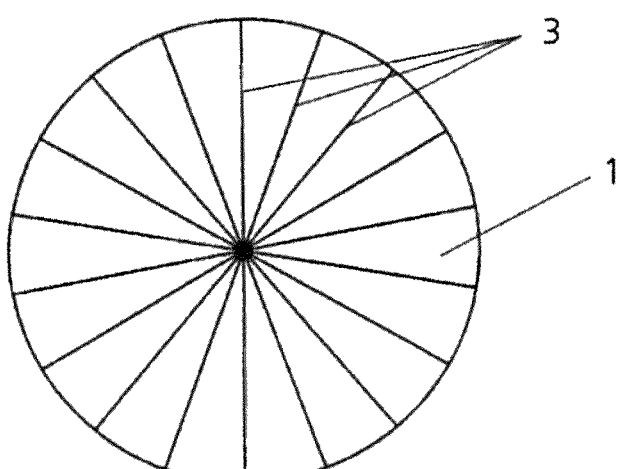
FIG. 10 shows a star-shaped arrangement of the conductor tracks.
Figure 11A:
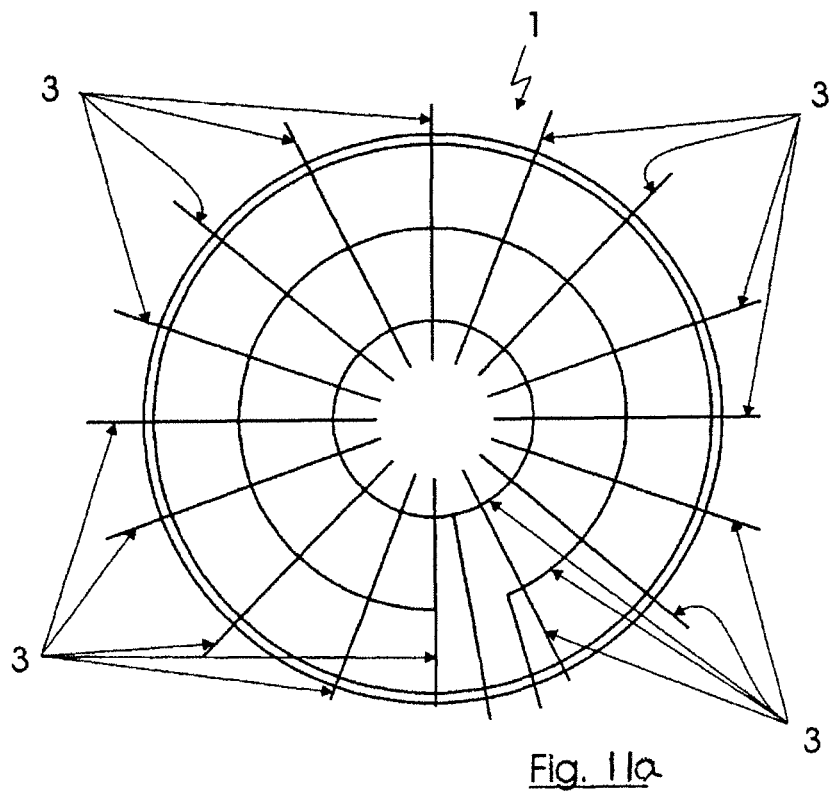
FIGS. 11a and 11b show rotationally symmetrical arrangements of the conductor tracks.

In order to minimize the light diffracted at the conductor tracks and the desired power supply, it is expedient to minimize the length of the feeder wires. For a uniform driving of correction elements over the area, preceding from an almost round optically utilized region such as is typical of areas near the pupil, a radial approach is conceivable. In this case, it may be provided that the arrangement of the conductor tracks or the thermal actuators has an at least approximate rotational symmetry about the optical axis, where the order of symmetry (rotation through 360°/order of symmetry transforms the arrangement into itself) is 2 or higher; FIG. 10 shows in plan view such a possibility that is suitable in particular for compensating for multiple ripple. The individual conductor tracks are connected via heating resistors or coils (not illustrated here). In this case, the conductor tracks 3 are arranged radially in star-shaped fashion in the optical element 1; a variant in which the conductor tracks 3 are realized as a rotationally symmetrical grating is illustrated in FIG. 11a in plan view. The individual conductor tracks are connected via heating resistors (not illustrated here). It is naturally the case that here, too, not all the crossover points of the conductor tracks which are connected to one another by resistors can be driven individually.

Figure 11B:
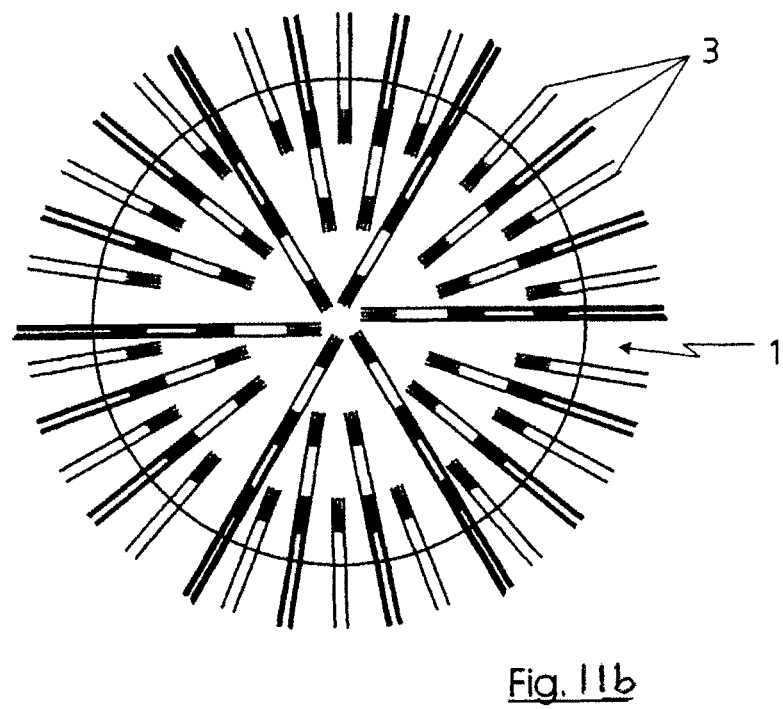

A further rotationally symmetrical variant is shown in plan view in FIG. 11b. No further heating resistors are provided in this embodiment. The locally different heat input is realized via the locally different density of the conductor tracks. This enables a spatially high-resolution temperature control in the optical element 1.

Figure 12:
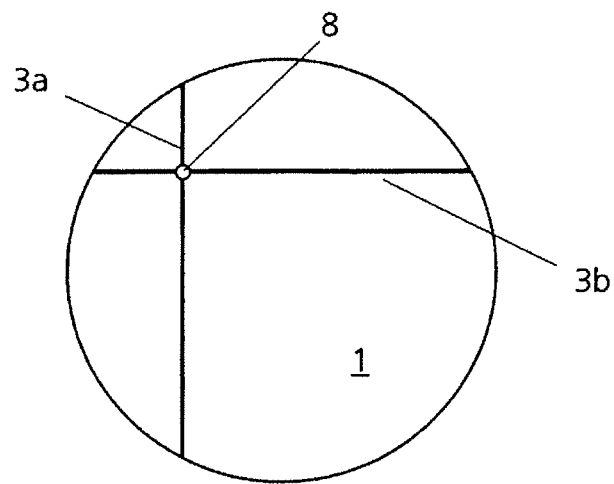
FIG. 12 shows a variant of the disclosure in which the conductor tracks are connected at their crossover points via resistors.

FIG. 12 shows the embodiments, illustrated above merely in plan view, in detail at a crossover point of the conductor tracks. In this case, the conductor tracks 3a and 3b are connected at their crossover point via a resistor 8. Optionally, a diode, a Zener diode, or a combination of resistor, a diode and a Zener diode can also be involved. If a voltage pulse is then applied simultaneously to the conductor tracks 3a and 3b depicted, the resistor 8 at the crossover point of the conductor tracks 3a and 3b is heated selectively. Optionally, the resistor is not just limited to the crossover point, but rather is arranged in meandering fashion. In this case, the heating along the conductor tracks 3a and 3b can be kept low by virtue of their resistance being kept low relative to that of the resistor 8. There is the possibility of arranging the conductor tracks 3 in an equidistant or non-equidistant manner. For the case where the conductor tracks 3a and 3b are contact-connected separately, the possibility is afforded of separately applying voltage pulses to the conductor tracks 3a and 3b. In this way, it is possible to a certain degree to set the heating power in the resistor 8 and along the conductor track 3a and 3b per se. This affords the possibility of correcting point aberrations via the resistor 8 and linearly extended aberrations using the conductor track 3a and 3b. The two conductor tracks 3a and 3b are illustrated merely by way of example in FIG. 12. A multiplicity of conductor tracks 3 may be arranged on the optical element 1 in order to efficiently distribute heating power over the optical element. If degrees of freedom in the correction can be dispensed with for reasons of symmetry, e.g. mirror symmetry or centrosymmetry or rotational symmetry with respect to an azimuth such as 180°, 90° or 45°, in the application of the optical radiation to the optical element, then this has the consequence that individual conductor tracks can also be short-circuited among one another, which results in a simplification of the production of the optical element 1.

Figure 13:
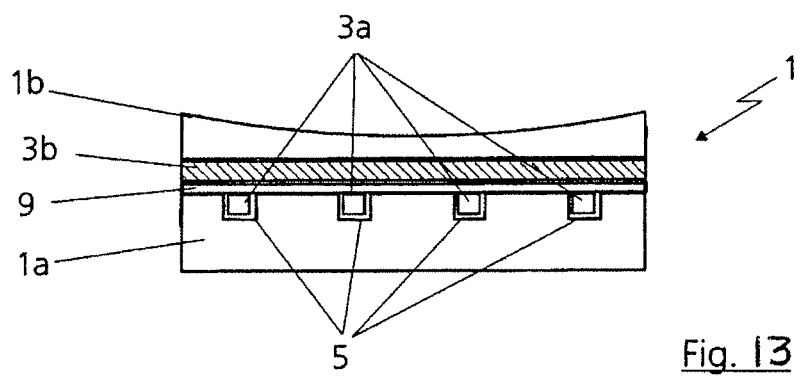
FIG. 13 shows a modification of FIG. 10.

FIG. 13 shows a variant in which the embodiment illustrated in FIG. 12 is combined with the concepts of FIG. 4. In this case, one set of conductor tracks 3a is arranged in the substrate 1a in a manner buried in cutouts 5. The other set of conductor tracks 3b is arranged on a surface of the second substrate 1b. By etching the surface of at least one of the two sets of conductor tracks 3 and subsequently applying a resistive layer 9 or by spot welding it is ensured that the contact region at the crossover point of the conductor tracks 3a and 3b has a higher resistance than the conductor tracks 3a and 3b themselves. In the illustration chosen in FIG. 12, the upper set of conductor tracks 3b is likewise arranged in buried fashion in the second substrate 1b parallel to the plane of the drawing, such that cementing of the two substrates can be dispensed with. In some embodiments, a cement layer (not illustrated) can be used; in this case, the burying of the conductor tracks 3a and 3b in their respective substrates 1a and 1b can be dispensed with.

Figure 14:
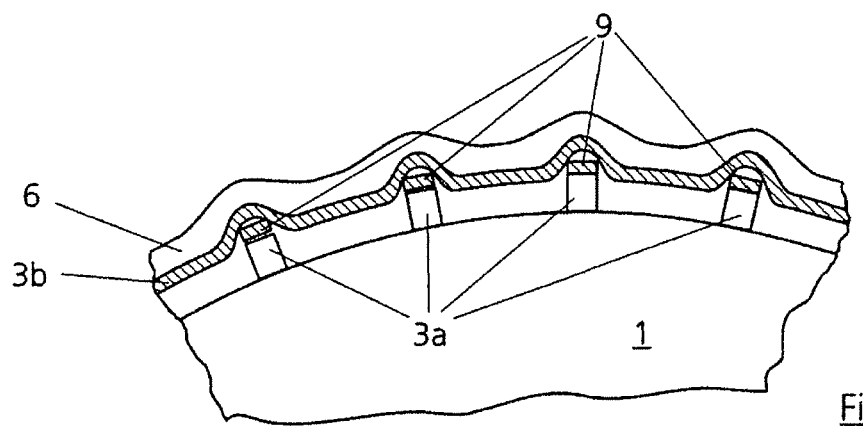
FIG. 14 shows a modification of FIG. 10.

FIG. 14 shows a variant of the disclosure in which the procedure illustrated in FIG. 12 is employed on the surface of an optical element 1. In this case, the conductor tracks 3a are arranged on the surface of the optical element 1 itself, and are covered by the resistive layer 9 in the region of the crossover points with the second set of conductor tracks 3b running above. The arrangement is covered by the optical layer 6 as antireflection layer.

Optionally, the two conductor tracks 3a and 3b can be connected via a further conductor track having a smaller cross section. For this purpose, the procedure as illustrated in FIGS. 13 and 14 are adopted with the difference that an insulating layer is involved instead of the resistive layer 9. In this case, the further conductor track can be produced by the insulating layer being perforated locally by spot welding, laser welding, spark flashover or a lithographic production process, whereby at the crossover points a region between the conductor tracks 3a and 3b is produced which has a finite yet significantly higher resistance than the track resistance of the conductor tracks.

Figure 15:
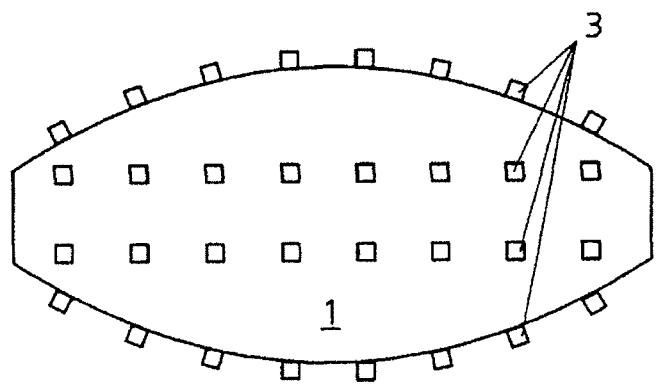
FIG. 15 shows conductor tracks on both sides of the optical element.

FIG. 15 shows an optical element 1 in which conductor tracks 3 are arranged on both sides and in the inner region. In this case, the conductor tracks 3 can be formed such that they are flat or adapted to the incident wavefront. This affords the possibility, for example by heating, of three-dimensionally influencing the density of the material of the optical element 1 and hence the refractive index. This enables the correction of homogeneity or voltage aberrations even in the case of optical elements 1 through which radiation is transmitted at large angles.

Figure 16:
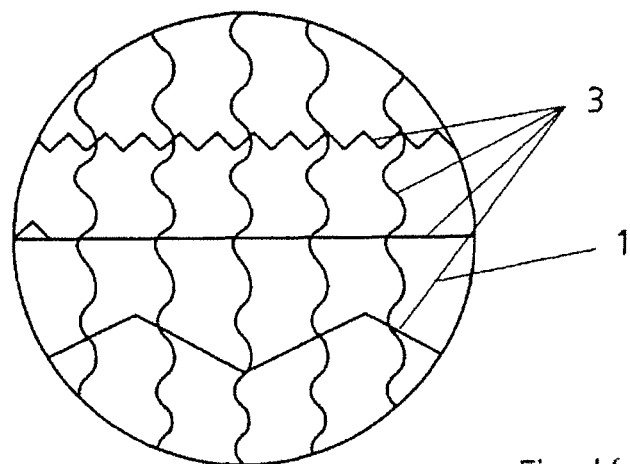
FIG. 16 shows various irregular matrix structures.

FIG. 16 illustrates various variants as to how the matrix structure of the conductor tracks 3 can be configured in locally variable fashion, whereby the optical action of the conductor tracks 3 is distributed over a larger angle space. Thus, for example the density of the conductor tracks 3 can be varied or else it is possible to vary a differing degree of coiling of the conductor tracks 3 in terms of frequency and amplitude in order to adapt the local heating power densities optimally to the desired properties. In this case, the form of the coiling of the conductor tracks 3 can be chosen for example in sinusoidal fashion or else along sawtooth, triangular or other functions. It goes without saying that there is also the possibility of varying the profile of the conductor tracks 3.

Figure 17:
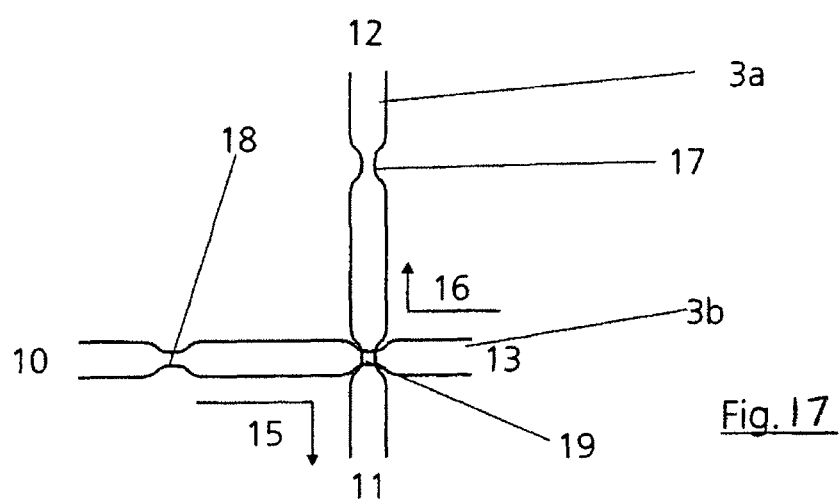
FIG. 17 shows an embodiment without resistors or a resistive or insulating layer.

FIG. 17 shows a variant in which resistors or a resistive or insulating layer can be dispensed with. In this case, the conductor tracks 3a and 3b are formed with a reduced cross section in the vicinity of their crossover points. The crossover point itself is realized in conducting fashion; this can be realized by vapour deposition one above another or spot welding. In some embodiments, the desired structure can be produced by a metallization layer being applied, e.g. by vapour deposition, in areal fashion, from which layer the structure is subsequently produced e.g. via an etching process. A conductor track having an identical thickness in the entire region of the optical element 1 can be applied in a particular simple manner, only the width of the conductor track being varied. A disadvantage of this variant is that the tapered portions 17 and 18 of the current-carrying conductor tracks 3a and 3b, respectively, heat up to an identical extent. A selectivity can be achieved by a procedure in which a voltage is not applied simultaneously in each case to the conductor tracks 3a and 3b, but in each case only one end of the conductor tracks 3a and 3b. In other words, a voltage is applied between the points 10 and 11 in a first pulse and a voltage is applied between the points 12 and 13 in a second pulse. A current flows in the direction indicated by the arrow 15 during the first pulse, and in the direction of the arrow 16 during the second pulse. As a result of this measure, twice the power as at the tapered portions 17 and 18 is liberated at the crossover point 19 on average over time.

One possible issue in the case is that of crosstalk between individual conductor tracks. This issue becomes relevant particularly when the area coverage considered in a plan view in the optical element becomes very large.

An explanation will be given below, with reference to FIG. 18, of one possibility for realizing a 2-dimensional array of individually drivable heating zones 101 which satisfies the very stringent desired properties of the maximum area coverage, that is to say of that proportion of the surface of the optical element 1 which is covered by the conductor tracks 3, the homogeneity of the area coverage, the homogeneity of the temperature distribution and the mutual crosstalk, that is to say the liberation of undesired heating power in a non-driven heating zone 101.

For a regular grating-type structure of the conductor tracks 3 for example in the pupil plane of a projection objective, the resulting scattered light component in the array is to a first approximation proportional to the area coverage. Typical scattered light levels of modern objectives of significantly less than one percent permit only a maximum area coverage of a few thousandths. Furthermore, the area coverage is as homogeneous as possible.

Depending on the illumination setting and the structures to be imaged, the light intensities in this pupil plane are focused differently and to a relatively great extent especially in the case of dipole illumination settings. An area coverage of the heating elements which uniformly affects all diffraction orders is chosen for example.

Therefore, the area coverage averaged over the typical size of a dipole spot is desirably homogeneous within a few percent over the entire optically free region, that is to say over the entire region through which the optical useful radiation passes.

Figure 18:
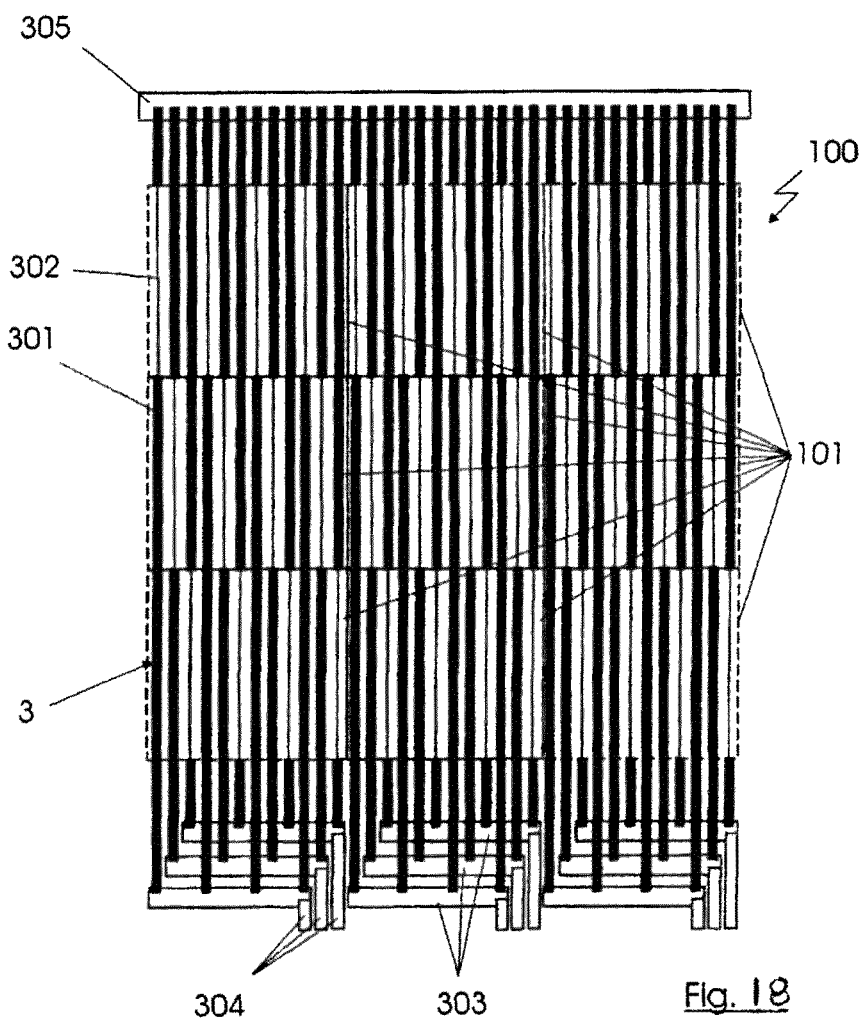
FIG. 18 shows a possibility for the spatially highly resolved thermal driving of different surface regions of an optical element.

Since the conductor tracks 3 cause a local heat input into the material of the optical element 1, which is not illustrated in FIG. 18, a so-called temperature ripple, that is to say a variation of the local temperature, forms at the surface of the optical element. In this case, the penetration depth of the temperature ripple into the optical element 1 corresponds approximately to the spacing of the conductor tracks 3. In order that the influence of the temperature ripple on the optical wavefront is kept small, the spacing of the conductor tracks are therefore desirably chosen to be dense enough. An arrangement of the conductor tracks 3 that is as regular as possible is advantageous for the same reason.

FIG. 18 illustrates by way of example on the basis of a heating array 100 composing 3×3 heating zones 101, by forming the conductor tracks 3 as an arrangement of sections of feeder wires 301 and heating wires 302. In this case, the feeder wires 301 are chosen to have low impedance so as to cause a least possible heat input into the non-driven heating zones 101 traversed. The heating wires 302, by contrast, are chosen to have high impedance via a cross-sectional reduction e.g. as illustrated in FIG. 18, in order to generate the desired heat power locally in the assigned heating zone 101 and introduce it into the optical element 1, which is not illustrated in FIG. 18.

The individual partial sections of the conductor tracks 3 that are formed in sections as feeder wires 301 and heating wires 302 as illustrated are here electrically contact-connected jointly via a bridge 303 in each case for a heating zone 101, which bridge, for its part, can be connected via a connecting pad 304 to a voltage source (not illustrated). On the opposite side, the contact-connection of the conductor tracks 3 is effected via the common busbar 305, which can be used jointly for all the conductor tracks 3.

In the exemplary embodiment, the resistance of the feeder wire 301 or the feeder track 301 in relation to the resistance of the heating wire 302 is chosen to be as small as possible in order to minimize undesired heating-up in that region traversed by the feeder wires 301. A substantially lower heating-up in the region of the feeder wires 301 is limited to the heating zones 101 lying one behind another in the direction of the conductor tracks 3 and is homogeneous within the heating zones 101. It is thereby possible to decouple the parasitic heating power component on the driving side via a simple decoupling transformation; in other words, suitable closed-loop control, on account of the knowledge of the driving of the desired heating zones 101, can compensate for the parasitic effects in the heating zones 101 of the same heating zones arranged one behind another.

In this case, the maximum parasitic heating power component within a heating zone 101 should not be greater than 10%-20% of the desired heating power.

The parasitic heating power component is proportional to the number of heating zones 101 within a column minus one and the feeder resistance and the heating resistance along a zone. For a heating array including a lateral extent of 10 heating zones 101 and a sought crosstalk of 10%, this results in a desired resistance ratio of $R_{feed}$ (resistance of the feeder wire 301)d/$R_{heat}$ (resistance of the heating wire 302)=1/90, and in the case of a heating array including a lateral extent of 15 heating zones 101 this results in an $R_{feed}/R_{heat}=1/140$. The resistance of feeder wires 301 and heating wires 302 can be set by way of the line width, the layer thickness, the material choice and by way of the effective line length. Such optical elements have 100 to 225 heating zones.

The maximum value of the absolute resistances R=U/I is limited by the desired voltage U in order to realize a predetermined heating power. At an operating voltage of less than or equal to 200 V, the electronic and connection components can be realized compactly. Although higher operating voltages are conceivable, they involve an increasingly higher outlay in order to avoid electrical flashovers and to ensure the dielectric strength of the electronic components.

The minimum possible feeder resistance is downwardly limited by the maximum permitted wire cross section, which is in turn limited by the permitted area coverage, and also by the resistivities of suitable conductive materials. In this case, pure elements have the lowest possible resistivities; the resistivities of alloys are generally higher than those of the elements. For a predetermined length of the heating zones 101 and a predetermined cross-sectional limitation, the minimum possible resistance is limited by the resisitivities of available conductive materials. Metals having a low resistivity such as Ag, Cu, Au, Al, Wo, Mo, Sn or Ni are suitable, for example, as materials for the feeder wires 301.

Generally, one should strive for a lowest possible feeder resistance. Higher resistances of the heating wires 302 can be achieved by reduced cross sections of the heating wires 302 relative to the cross sections of the feeder wires 301. Moreover, the effective length of the heating wire 302 may be lengthened via a meandering configuration in order thereby to increase the total resistance of the heating wire 302. The heating wire resistances can theoretically be increased arbitrarily by way of the effective length, but this is detrimental to the area coverage, for which reason length factors of between 1-50 are possible.

A second conductor material, the resistivity of which is greater than that of the feeder wires 301, can additionally be chosen for the heating wires 302 in the zones 101 to be heated. Metals having a relatively high resistivity such as, for example, Ni, Pt or Cr or semiconductors such as Si or Ge can be chosen, for example, as materials for the heating wires 302. In some embodiments, the resistivities of the materials used are optimally adapted by doping with impurity elements. In the case of metals, the resistivity can be artificially increased by doping or by introduction of alloying constituents; in the case of semiconductors, the resistivity can be artificially reduced by introduction of doping elements.

This can be achieved by doping some of the conductor tracks, in particular the feeder wires and/or the heating wires.

Figure 19:
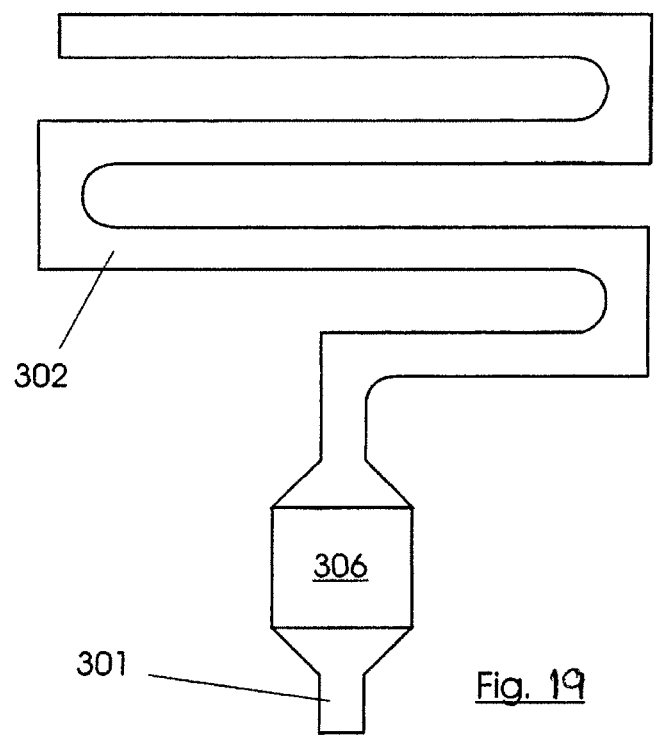
FIG. 19 shows a feeder wire, of a meandering heating wire and of the transition region.

An embodiment of the feeder wire 301, of a meandering heating wire 302 and of the transition region 306 between the individual sections is shown in FIG. 19. In order to avoid high current densities at the inner corners of the heating wire 302, the course of the heating wires 302 is rounded by radii at least in sections.

In some embodiments, phases can also be provided. Furthermore, a transition zone having a larger overlap region is to be provided in the transition region 306 of the two materials in order to reduce the current densities in this region and thus to eliminate the risk of electromechanical degradation at the boundary layer. The enlarged overlap region alleviates the desired overlay properties if feeder wires 301 and heating wires 302 are patterned in two separate lithographic processes.

Figure 20:
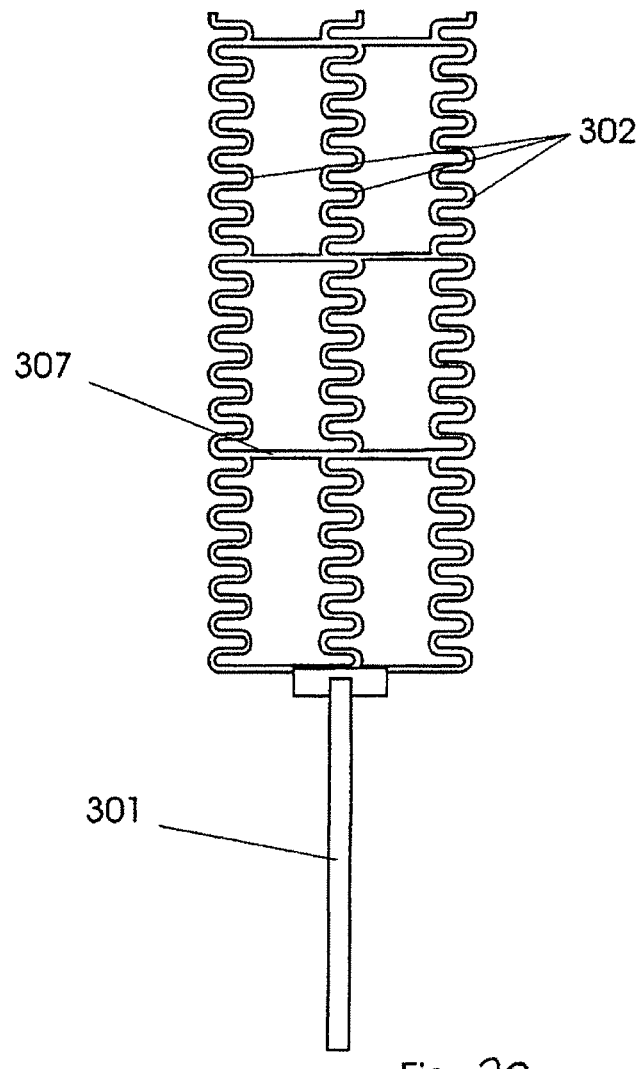
FIG. 20 shows one possibility for arranging the heating wires in such a way that the latter are robust with respect to local defects.

Since, in the case of the heating wires 302, depending on the desired properties, very thin lines having the smallest possible layer thicknesses are sought in order to set the electrical resistance to the desired level, there is here an increased risk of defects as a result of constrictions, material thinning, layer defects, resist defects, particles and stitching defects. An arrangement which is robust with respect to such local defects is illustrated in FIG. 20. Instead of an individual meander, now a plurality of meandering sections of the heating wire 302 are arranged parallel and connected transversely at regular spacings with bypasses 307. If a local defect occurs in one of the sections, then the current passes around this location via the bypasses 307 and the adjacent meandering sections.

Depending on the number of heating zones 101 per optical element 1 and the number of heating wires 302 per heating zone 101, a few hundred up to a few thousand wires have to be electrically contact-connected. As shown in FIG. 18, on one side of the heating array 100 it is possible to combine all the feeder wires at a common busbar 305. On the opposite side, all the conductor tracks 3 which are assigned to the same heating zone 101 can be combined via bridges 303. This reduces the number of connecting lines to the number of actively driven heating zones 101.

Figure 21:
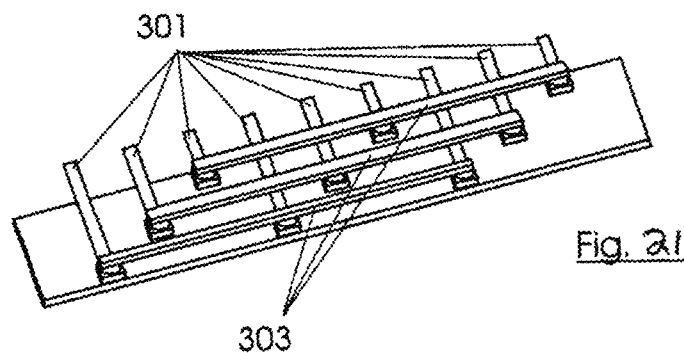
FIG. 21 shows a three-dimensional basic illustration of the grouping of the conductor tracks.

In some embodiments, the bridges 303 are realized with the aid of a second level with conductor structures, which is electrically insulated from the first level with the conductor tracks 3 via a suitable dielectric. Via contact-connecting holes, all the feeder wires 301 associated with a heating zone 101 are connected to the bridge 303. The electrical connection towards the driver electronics can then be performed via a contact area on the second level or an uncovered contact area on the first level; a basic illustration of this solution is shown in FIG. 21.

In some embodiments, the bridges 303 are realized by bonding wires, whereby the patterning of a second level can be obviated.

In certain embodiments, the bridges 303 are realized in the connection board. In this case, although the number of contact-connecting points corresponds to the number of conductor tracks 3, the number of lines led out is reduced to the number of heating zones 101.

After the reduction of the lines via the measures outlined above, the number of lines led out, corresponding to the number of heating zones or heating wires, is typically a hundred to several thousand. Therefore, it is additionally desirable to electrically link a multiplicity of connecting lines to the optical element 1 as far as possible in a manner free of forces, since forces and moments introduced via the electrical feed line can cause deformation, tilting and changes in position of the optical element 1 which in turn give rise to optical aberrations.

In a first embodiment, the electrical connection is realized via wire bonding onto a transfer board, the transfer board being mechanically decoupled from the optical element 101. Since the bonding wires can be chosen to be very thin and the arcuate geometry is favourable with regard to minimizing the mechanical stiffness, bonding bridges constitute electrical connections having minimal mechanical stiffness and hence optimal mechanical decoupling.

Figure 22:
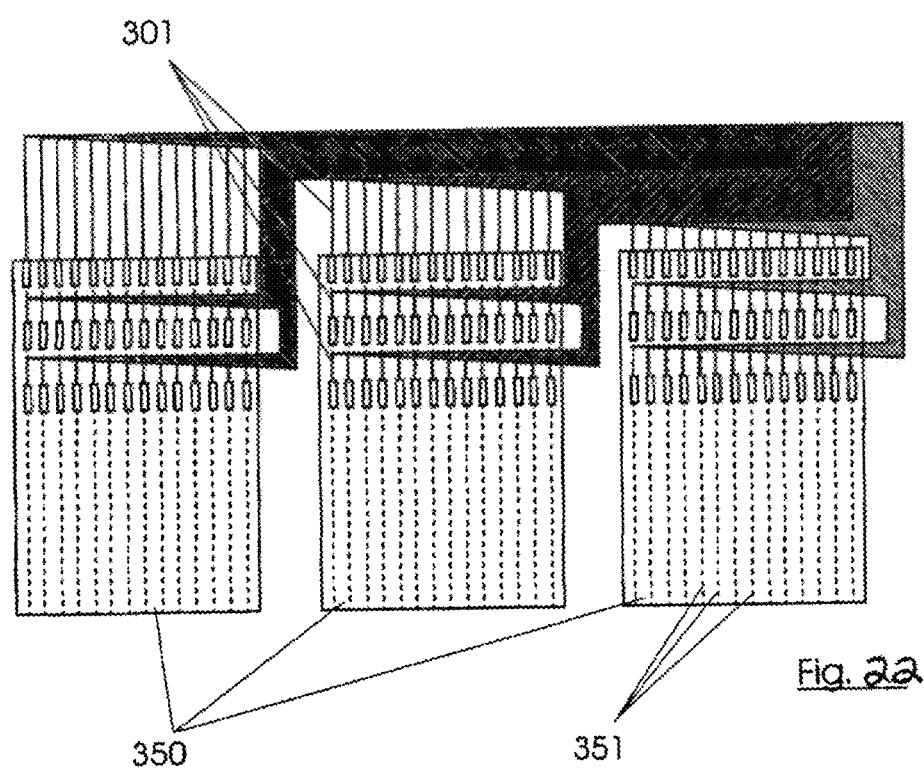
FIG. 22 shows a contact-connection and grouping via flexible conductor films for electrical linking.

In some embodiments, flexible conductor films 350 can also be used for electrical linking, as shown in FIG. 22. In this way, in this case all the feeder wires 301 assigned to a heating zone 101 can be arranged one behind another in alignment on the same contact-connecting track 351 on the flexible conductor film, whereby the contact-connecting complexity is reduced. Furthermore, it is possible to arrange the contact-connecting tracks associated with one row on the same conductor film 350. In order to reduce the area stiffness of the flexible conductor films 350, an S form or a plurality of undulations similar to a bellows can be impressed. Furthermore, the flexible conductor film 350 is slotted in sections along the contact-connecting series in order to prevent shear stresses, which can result in a deformation of the optical element, from being built up by way of the area stiffness of the flexible conductor film 350. Suitable methods for electrically contact-connecting the flexible conductor film 350 to the contact points of the optical elements are electrically conductive adhesive, aniosotropically conductive adhesive or adhesive tapes, anisotropically conductive tapes, soldering connections via stamp soldering, furnace soldering, hot air soldering or laser soldering, and also wire bonding.

In order to avoid creepage currents and flashovers, it is possible to embed the conductor tracks on the optical element into an $SiO_2$ layer or layer of some other optically transparent dielectric. Such a layer covers possible surface defects and roughnesses caused by the patterning process and can be overpolished in order to achieve the desired surface accuracy of the optical element.

An issue that can arise relates to the scattered light generated by the conductor tracks with an increasing area coverage of the conductor tracks. The following embodiments of the disclosure are formulated for projection objectives for microlithography. However, they are also conceivable for other optical systems.

The scattering light component caused by the conductor tracks in the wafer plane of a projection exposure apparatus may also be dependent, besides the area coverage, on the orientation of the conductor tracks relative to the scanning direction. A field diaphragm in a field position downstream of the optical element can absorb a considerable portion of the scattered light caused by the conductor tracks, such that the scattered light is not incident on the wafer to be exposed. In this case, a favourable form of the field diaphragm corresponds to the image of the object field, in particular of the scanner field. Since the scanner slot is significantly narrower in the scanning direction than perpendicular thereto, it is possible to arrange the wires perpendicular to the scanning direction, such that the scattered light is diffracted in the scanning direction, in which case, by virtue of the field aperture that is narrower in this direction, a significantly greater portion is absorbed than perpendicular thereto.

Further possibilities will be given below by which the so-called scattered light, or synonymously spurious light, caused by the optical elements or by scattering or diffraction at the conductor tracks or thermal actuators can be reduced:

Spurious light is typically light whose propagation direction at the diffraction location deviates from the useful direction, that is to say from the direction provided for the optical useful radiation. If the diffraction takes place near the pupil, then this change in direction is translated into a positional change in the image, which leads to so-called double or ghost images.

Spurious light can be absorbed when it passes through locations not met by any useful beam path. The locations are, for example, in the region of intermediate images, if the spurious light is generated near the pupil, and pupil regions for spurious light generated near the field. According to the disclosure, diffractively acting correction means can be combined with spurious light diaphragms at these corresponding locations. For the case where the optical element is positioned upstream of a first intermediate image in the light direction in an optical system such as e.g. in a projection objective, a spurious light diaphragm in the vicinity of the intermediate image may be advantageous.

An exemplary method for designing such spurious light diaphragms includes the following steps:
1. Designing the optical correction element
2. Determining its diffractive action
3. Calculating the useful beam path and also the light paths of the diffracted light through the system. This can be done for instance by positioning test areas in the context of a ray-based simulation in the system and calculating in each case those regions on the test areas on which useful radiation and spurious light pass through.
4. Determining objective regions through which spurious light passes but useful light does not pass. This can be done by forming the differential sets of the test area regions described in point 3.
5. Testing whether these objective regions are suitable for positioning spurious light diaphragms. If appropriate providing a spurious light diaphragm at these locations.

By designing and positioning the spurious light diaphragms, therefore, essentially the following conditions are intended to be met:

light in the useful beam path passes uninfluenced through the spurious light diaphragm at least one portion of the light which is diffracted upon regular irradiation by the conductor tracks or the thermal actuators impinges on the spurious light diaphragm.

In the systems with a rectangular field discussed, the field is greater orthogonally to the scanning direction than in the scanning direction. Spurious light can correspondingly be absorbed more easily in this "short" direction of the field than perpendicularly thereto. Scattered light through rectilinear conductor tracks which are oriented perpendicular to the scanning direction can therefore be more easily absorbed and thus reduced.

A variant of the disclosure consists in positioning the optical element in or near a pupil plane, while the spurious light diaphragm is placed nearer the field and is fitted laterally alongside the useful beam path at least partly in the direction of the short field direction.

The use of at least one aperture diaphragm arranged downstream of the optical element in the light direction also constitutes an effective possibility for suppressing spurious light.

The last area of an optical projection objective also constitutes a location where spurious light can be absorbed.

Some further alternative forms of realization of the optical elements will be presented below:

For applying the conductor tracks or the thermal actuators, plane-parallel plates are suitable as optical elements. In some embodiments, the conductor tracks or the thermal actuators are arranged on curved, if appropriate aspherical areas. In this case, the curved surfaces can exhibit a radius of curvature of less than 10,000 mm, such sa less than 5,000 mm. For this purpose, it is possible to wring one element onto another curved element and process and structure them in plane fashion. The curved, structured surface form will be established after the release from wringing. Reasons for arranging the conductor tracks or the thermal actuators on curved areas may include lack of structural space in the expedient subaperture region or a desired amplification of the change in refractive index at limited power, for example if a high degree of beam deflection takes place in the relevant region and the relevant element thereby reacts particularly sensitively to changes in the refractive index.

Furthermore, optical elements can be divided between different individual elements for other reasons and present themselves, by virtue of this division that is involved anyway, as carriers of correction means such as e.g. conductor tracks or thermal actuators.

The use of crystalline optical materials such as calcium fluoride, barium fluoride, barium-lithium fluoride, other fluorides, LuAG (lutetium aluminum garnet) or spinel which exhibit intrinsic birefringence in the ultraviolet range is also conceivable for realizing the optical element according to the disclosure. In order that the resulting birefringence in the system is kept small, it has already been proposed to split these elements into partial elements having a different crystal orientation and a different rotational position about the optical axis in such a way that the summational effect does not exceed tolerable limits. By way of example, the crystallographic principal axes in the [100], [111] or [110] direction can be oriented in the direction of the optical axis of the system; the corresponding compensation schemes are found variously in the literature.

In some embodiments, it is also conceivable to use the unavoidable diffraction effects caused by the conductor tracks or the thermal actuators as desired diffractive optical effects. In other words, the conductor structure applied on the optical element would have both a desired optical action and a desired thermal action.

Correction strategies for the design or application of the optical elements according to the disclosure:

For the correction strategies for the design or application of the optical elements it should be taken into consideration, in particular, that their correction potential is limited since, by way of example, the maximum permissible current represents a limiting factor. Therefore, in one example, there is provision to combine the optical elements with conventional manipulators (wavelength, gas composition, gas pressure and gas temperature, rigid body movements of optical elements or the flexure thereof from the edge) and to carry out the travel-intensive coarse tuning with these conventional manipulators, whereas only finer corrections are effected via the optical elements according to the disclosure. If it is known that certain correction degrees of freedom can be excited in principle in both directions, yet are desired only in one direction, then it is possible to generate in the system (either at the optical element itself or at some other optical part at an equivalent subaperture position) a bias in the desired direction for instance by aspherization, such that the zero state is already produced by movement of the manipulator in the otherwise useless correction direction. The desired correction action can then be achieved by movement of the manipulator back from this "useless" correction direction. A doubled adjustment range available for a wavefront correction results in comparison with a procedure without the abovementioned bias.

In order to compensate for production variations, it is expedient to create a calibration data record at the beginning for the optical element according to the disclosure. For this purpose, the individual local regions are driven with defined current intensity and the resulting influence on the wavefront is measured interoferometrically. On the basis of this information, the local regions are later driven in such a way that a highly accurate optical action of the local temperature changes is obtained.

In one example, the optical element may be designed as an exchangeable part. Thus, the correction means in one example can be adapted to the desired use of the projection exposure apparatus, such as, for example to dipole or quadrupole illumination. In addition, the exchangeable parts can have a different aspherical effect as a result of different surface forms or be designed for the correction of specific alterations of the projection objective as a result of compaction, for example.

If the optical element is embodied as a plane-parallel plate, it may be expedient to design the optical element such that it is displaceable in a divergent or convergent beam path along the optical axis. As a result of a displacement along the optical axis, the subaperture ratios then change appreciably on account of the divergent beam path, such that the optical element can operate in each case in the optimum region for the system state. Such a displacement can be expedient when, for instance, lifetime and lens heating effects are dominant in different subaperture ranges and cause disturbance with different weights depending on the utilization and duration for which the system has already been use. In general, the optical element can additionally be variable in terms of its position (decentring, tilting optionally about an axis parallel or perpendicular to the optical axis, rotation) and/or be designed in particular to be able to undergo astigmatic, three-leaf or four-leaf clover deformation (in the context of the loading limits of the conductor tracks or thermal actuators). The abovementioned displacements of the rotations/tilting of the optical element can also be provided, of course, when the optical element is situated in a non-divergent or convergent part of the beam path.

If the projection exposure apparatus is utilized in different operating modes, of which a first mode e.g. with uniform lens heating generates a small wavefront aberration but reacts sensitively to spurious light, while a second operating mode generates great heating effects but is more tolerant towards spurious light, it may be expedient to provide a rapid exchange of the optical element for an optical element which is unstructured and has the same optical action as the non-driven optical element according to the disclosure. The optical element that is unstructured and therefore generates no spurious light is used in the beam path in the first operating mode. In the second mode, the optical element is used and the wavefront aberration brought about by the for example non-uniform heating of the second mode is corrected by the element.

It is advantageous, therefore, if the optical element is designed in such a way that it can be exchanged during the operation of the projection exposure apparatus, that is to say in particular is held in a mechanical interchangeable holder and precautions are taken for simple accessibility.

In order to be able to expediently design the optical element according to the disclosure, the disturbance to be corrected are desirably known as precisely as possible. This information can be obtained in a first case from measurements of the wavefront aberration on projection exposure apparatuses during operation. In some embodiments, with irradiation that is constant on an average over time, it is possible to extrapolate to the absorbed quantity of light and the temperature distribution established. The temporally developing image aberrations can be calculated therefrom and used as a basis of a correction. In this case, the extrapolations can either be based on fast simulation calculations at the same time or be carried out on the basis of previous calibrations based on a measurement of the wavefront aberration. In any event measurements should then optionally be carried out at relatively short intervals if the irradiation changes, e.g. directly after a reticle and/or illumination change has taken place. After such a case, the temporal development will proceed particularly rapidly, such that in the first case the frequency of the system measurements can be adapted to the time interval with respect to the last change in irradiation and the system time constants (known at the outset by calculation or measurement). If the system approaches the static state ("goes to saturation"), measurement has to be effected less frequently and the throughput of exposed wafers of the projection exposure apparatus correspondingly increases.

A further potential issue, posed from the standpoint of the entire projection objective, is the location at which the optical element is to be arranged. In this case, the location should be understood in the sense of the optical effect of the optical element on the wavefront of the optical radiation of the projection objective.

Some desired positions of the optical elements in the optical system will be explained by way of example below. In this case, the so-called paraxial subaperture ratio serves as a measure of the position in the system.

The paraxial subaperture ratio is given by $$\frac{r}{|h|+|r|}\mathrm{sgn}h$$

where r denotes the paraxial marginal ray height, h denotes the paraxial principal ray height and the signum function sign x denotes the sign of x, where sgn0=1 shall be declared. A definition of the paraxial marginal ray and paraxial principal ray is given in "Fundamental Optical Design" by Michael J. Kidger, SPIE PRESS, Bellingham, Wash., USA, which is incorporated by reference herein.

The paraxial subaperture ratio is a signed variable that is a measure of the field or pupil proximity of a plane in the beam path. The subaperture ratio is normalized by definition to values of between −1 and 1, a zero of the paraxial subaperture ratio corresponding to each field plane, and a discontinuity with a jump in the paraxial subaperture ratio from −1 to +1 or from +1 to −1 corresponding to each pupil plane. For the present application, paraxial subaperture ratios of 0 correspondingly denote field planes, while a paraxial subaperture ratio in terms of magnitude of 1 determines a pupil plane.

Planes near the field therefore have paraxial subaperture ratios that are close to 0, while planes near the pupil have paraxial subaperture ratios that are close to 1 in terms of magnitude. The sign of the paraxial subaperture ratio indicates the position of the plane before or behind a reference plane. By way of example, the sign of the piercing point of a coma ray in the relevant area can be used for definition.

Two planes in the beam path are called conjugate if they have the same paraxial subaperture ratio. Pupil planes are conjugate to one another, as are field planes.

In this case, the optical elements or the arrangement can, in one example, be arranged at a location in the system at which the paraxial subaperture ratio for a first element or for a first arrangement is in terms of magnitude greater than 0.8, such as greater than 0.9. In addition, or in an alternative embodiment, an optical element or an arrangement can be present for which the paraxial subaperture ratio is in terms of magnitude less than 0.9, such as less than 0.8. In addition, a further optical element or a further arrangement can be present whose subaperture ratio is less in terms of magnitude than 0.8, and whose subaperture ratio has the opposite sign to that of the second element, or to that of the second arrangement.

In one embodiment, for two optical elements which are arranged at different locations in a projection objective, the respective paraxial subaperture ratios differ from one another by at least 0.15, such as by 0.3.

Figure 24:
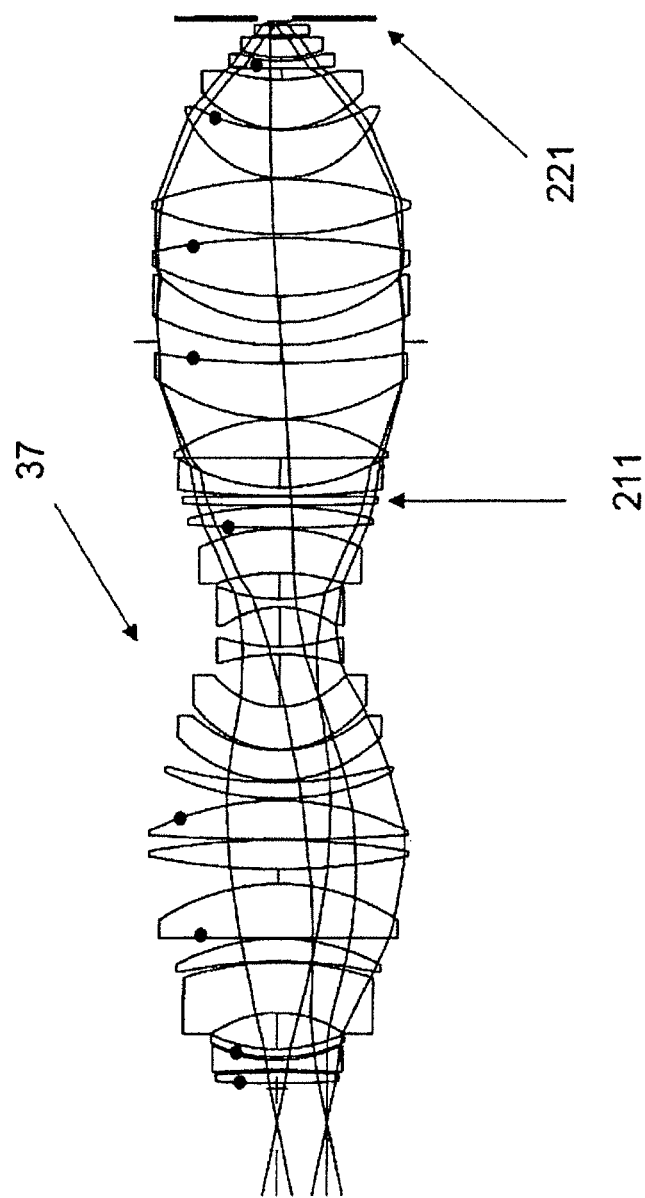
FIG. 24 shows a projection objective for microlithography with an optical element and a scattered light diaphragm.

The dioptric projection objective 37 in FIG. 24, which is also shown in WO 2003/075096 A2, the full scope of which shall hereby be integrated into this application, contains an optical element 211 designed as a plane plate. This plane plate is designed in interchangeable fashion. In one configuration of the optical element 211, the latter is equipped with the conductor tracks and can be interchangeable and/or non-interchangeable. The plane plate is situated at a location corresponding to a subaperture ratio of between 0.9 and 1.0. In order to avoid scattered light, the projection objective 37 can be provided with a scattered light diaphragm 221 between the last optical element in the direction of the beam path and the wafer (not illustrated here).

Figure 25:
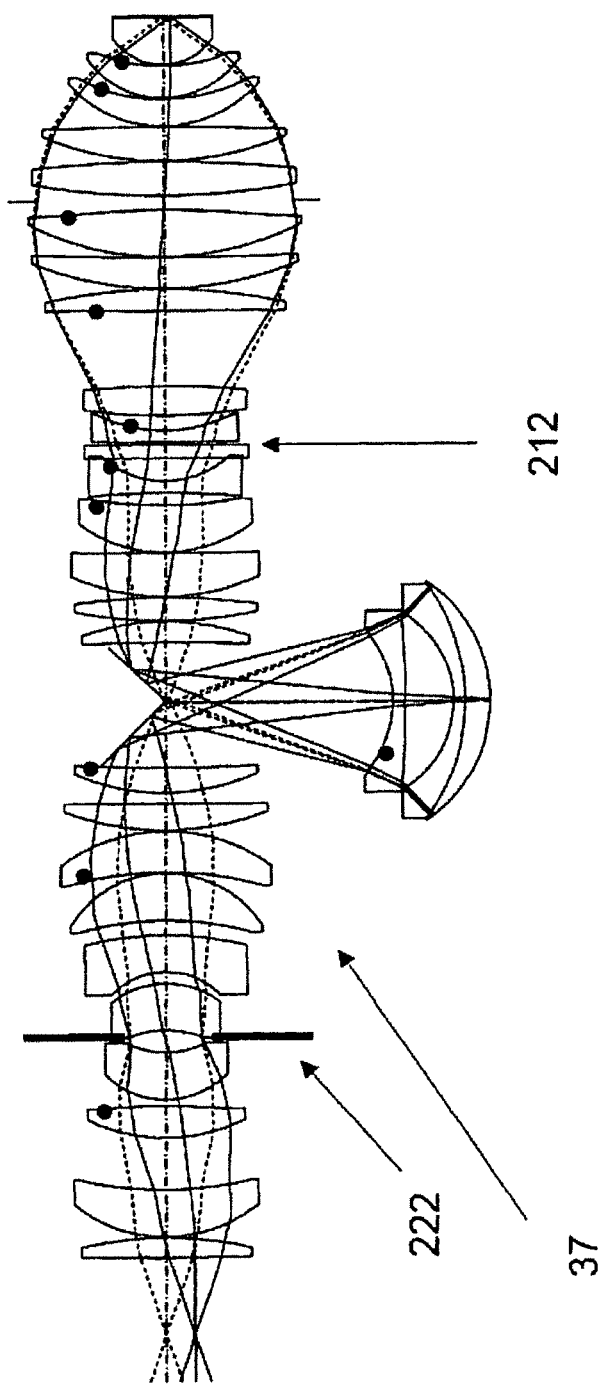
FIG. 25 shows a projection objective for microlithography with an optical element and a scattered light diaphragm.

The catadioptric projection objective 37 in FIG. 25 contains an optical element 212 designed as a plane plate. In one configuration of the optical element 212, the latter is equipped with the conductor tracks and can be interchangeable and/or non-interchangeable. The plane plate is situated at a location corresponding to a subaperture ratio of between −0.8 and −0.9. Therefore, this plane plate is somewhat nearer to the field than in the previous exemplary embodiment. In order to avoid scattered light, the projection objective 37 can be provided with a scattered light diaphragm 222 in a pupil plane of the projection objective 37.

Figure 26:
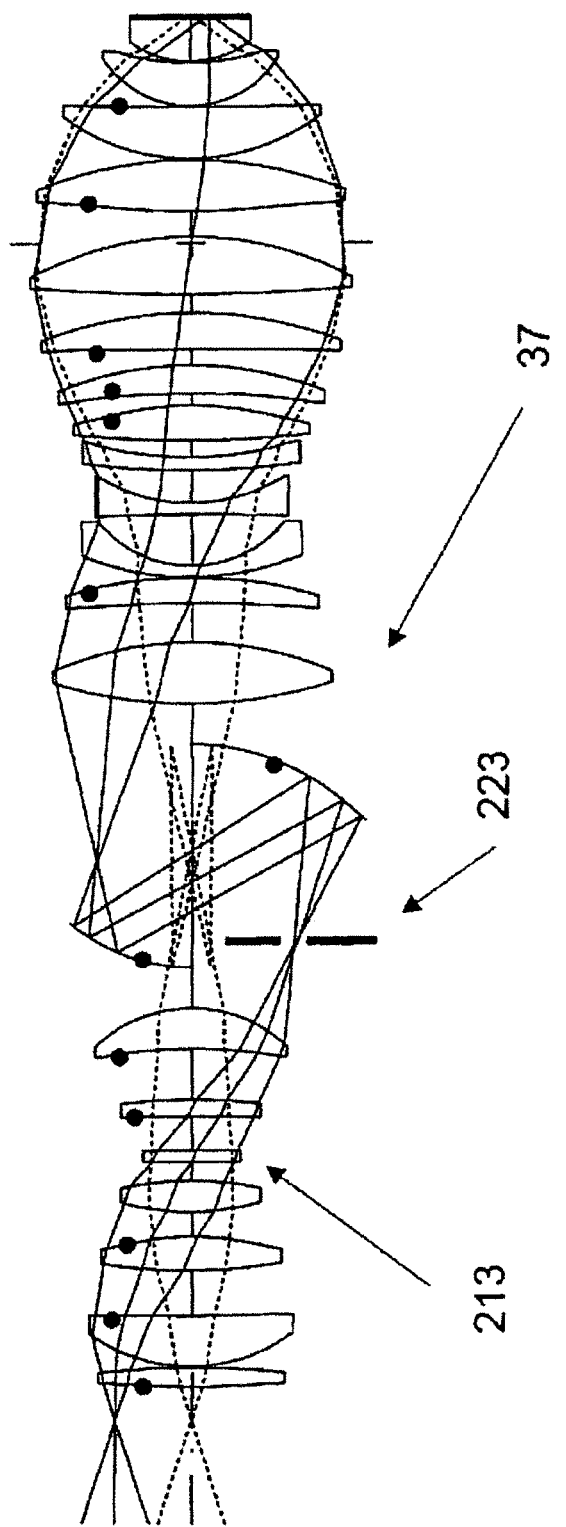
FIG. 26 shows a projection objective for microlithography with an optical element and a scattered light diaphragm.

The catadioptric projection objective 37 in FIG. 26, which is also shown in WO 2005/069055 A2, the full scope of which shall hereby be integrated into this application, contains an optical element 213 designed as a plane plate. This plane plate is designed in interchangeable fashion. In one configuration of the optical element 213, the latter is equipped with the conductor tracks and can be interchangeable and/or non-interchangeable. The plane plate is situated at a location corresponding to a subaperture ratio of approximately 1, which corresponds to a pupil plane of the projection objective 37. In order to avoid scattered light, the projection objective 37 can be provided with a scattered light diaphragm 223 in the vicinity of an intermediate image. In this case, the scattered light diaphragm can have the image of the scanner slot in the intermediate image plane.

The disclosure can likewise be used in catoptric projection objectives for microlithography.

In the three exemplary embodiments of the disclosure above, instead of one optical element it is also possible to use a plurality of such optical elements at different positions, which increases the correction possibilities.

Using two or generally a plurality of optical elements according to the disclosure, avoiding Moire effects can be encountered as an issue. The following embodiments of the disclosure are formulated for projection objectives for microlithography. However, they are also conceivable for other optical systems.

Figure 23:
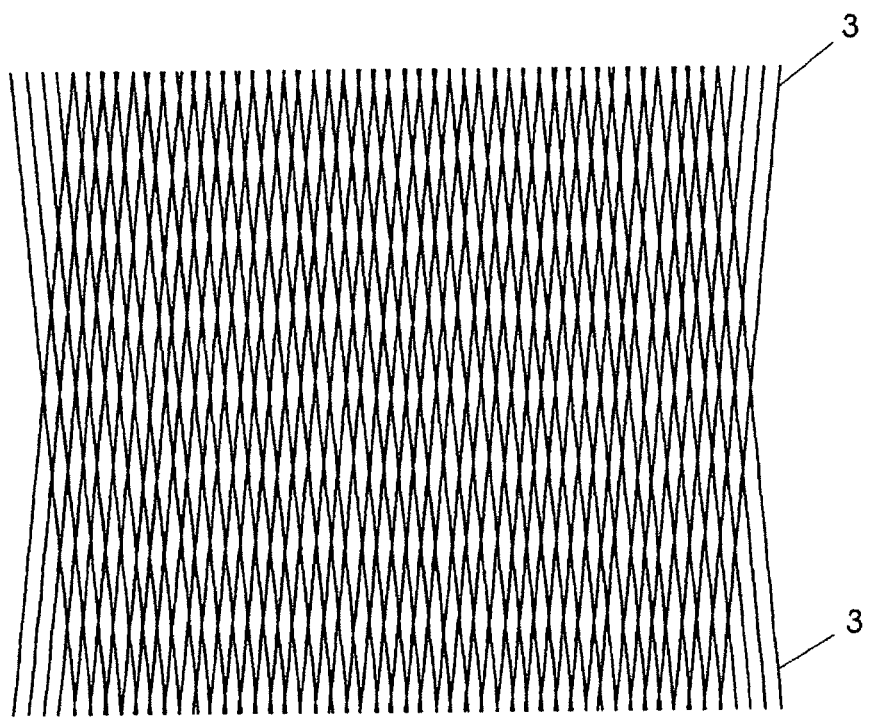
FIG. 23 shows two plate-type optical elements which lie one above another, for avoiding Moire effects and at the same time profiting from the desired direction with regard to scattered light.

One possibility for avoiding Moire effects is to arrange the optical elements in azimuthally interlaced fashion with regard to the orientation of their conductor tracks. By way of example, it is possible to effect interlacing by 90°. In order in this case not to have to completely relinquish the orientation—advantageous in terms of scattered light engineering and already discussed—of the conductor tracks orthogonally with respect to the scanning direction of the projection exposure apparatus, only a slight—in particular amounting to less than 5°—azimuthal interlacing of the conductor tracks of the respective optical elements relative to one another is performed, as illustrated in FIG. 23. such an interlacing can be performed relative to a plurality of individual optical elements according to the disclosure. However, it can also be performed within a single optical element according to the disclosure.

Figure 27:
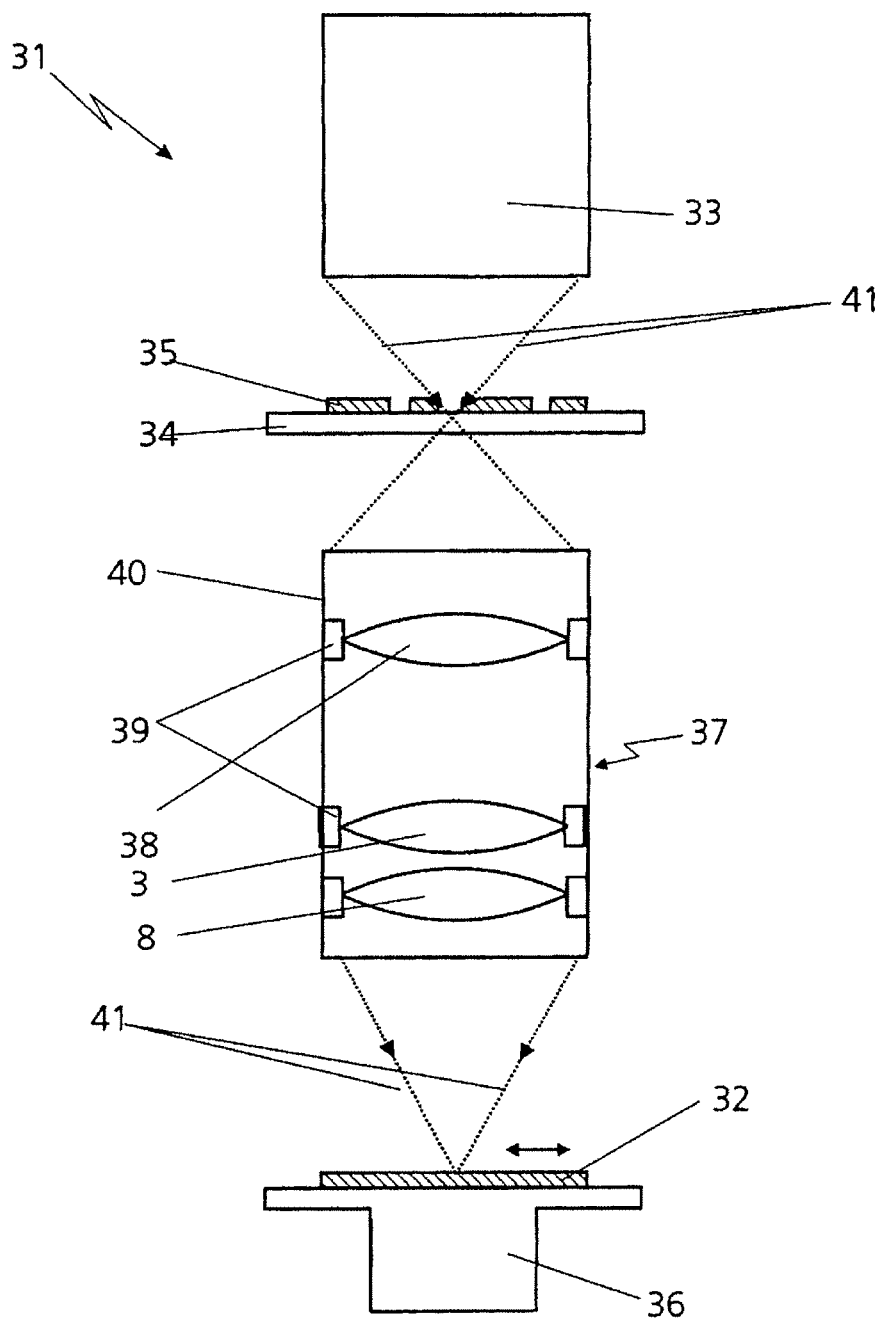
FIG. 27 shows a projection exposure apparatus for semiconductor lithography into.
Figure 1:
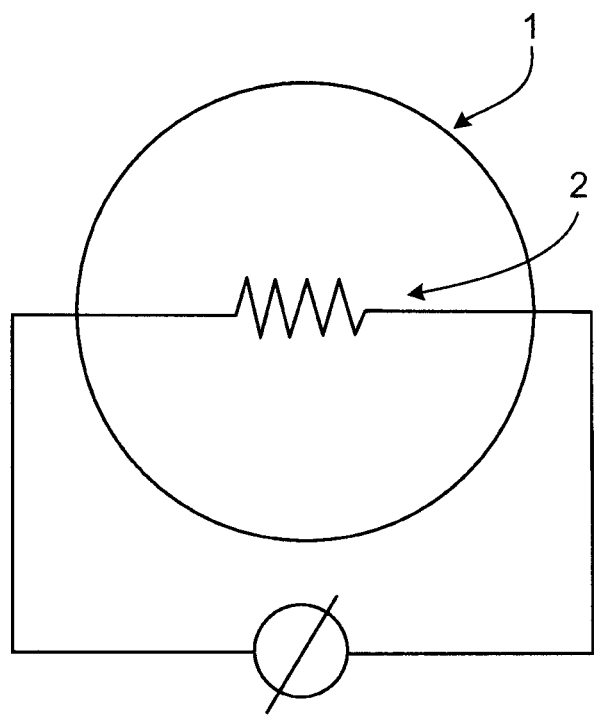
Figure 2:
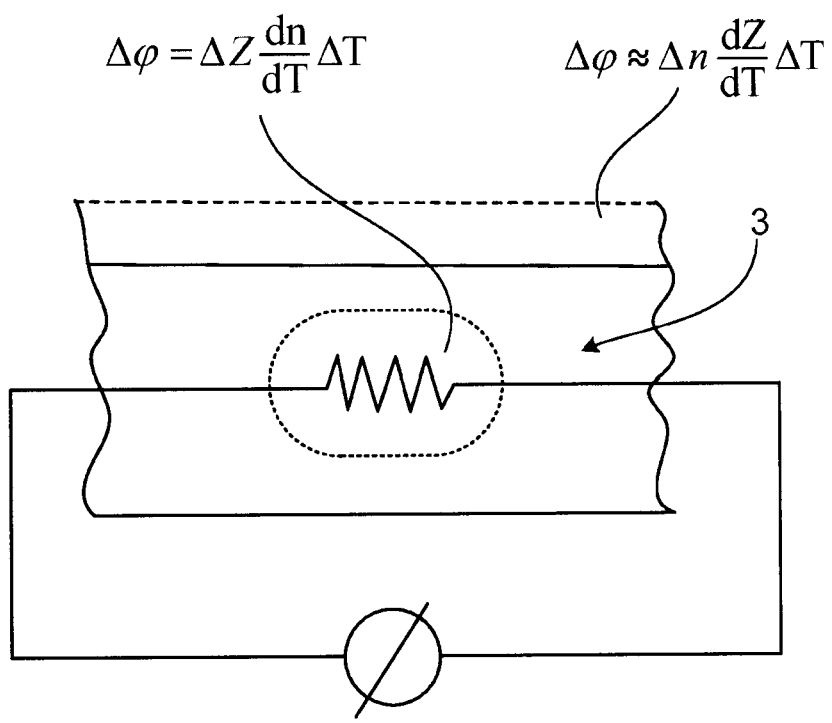
Figure 7A:
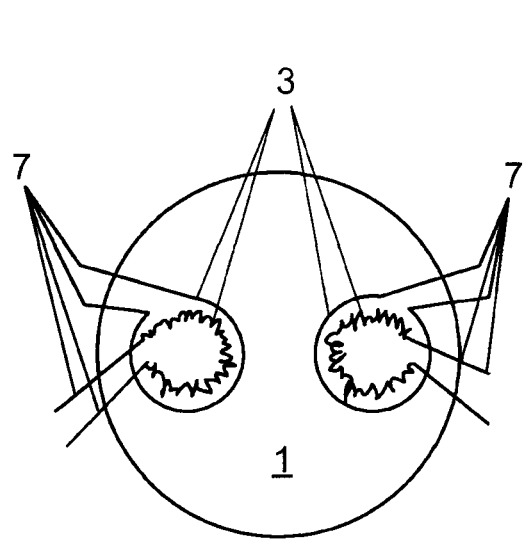
Figure 7B:
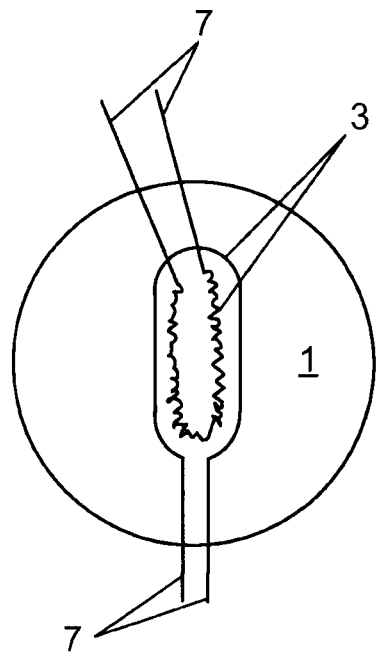
Figure 8:
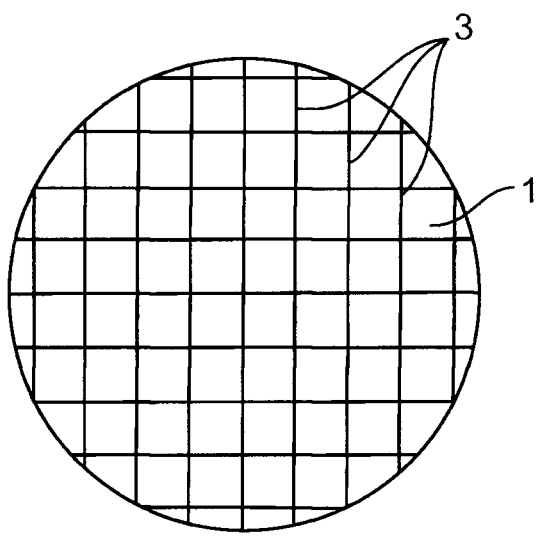
Figure 9:
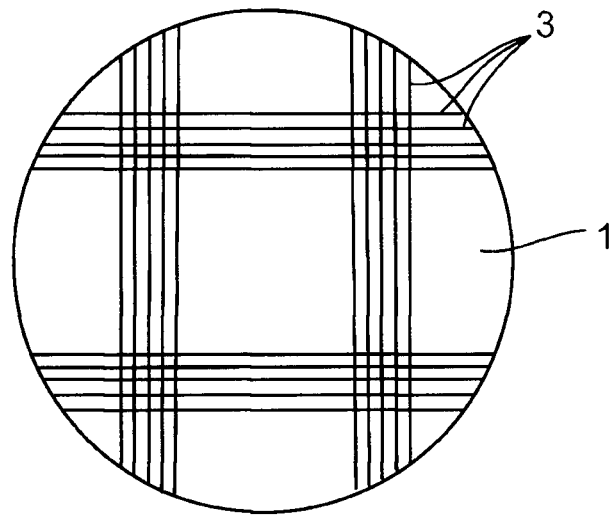
Figure 10:
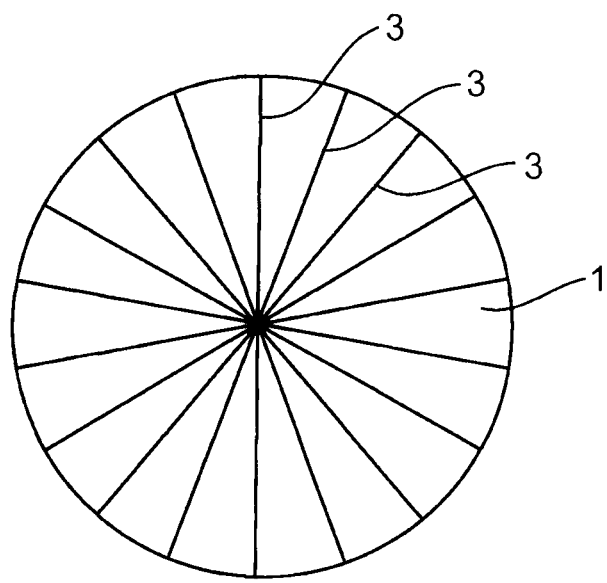
Figure 11A:
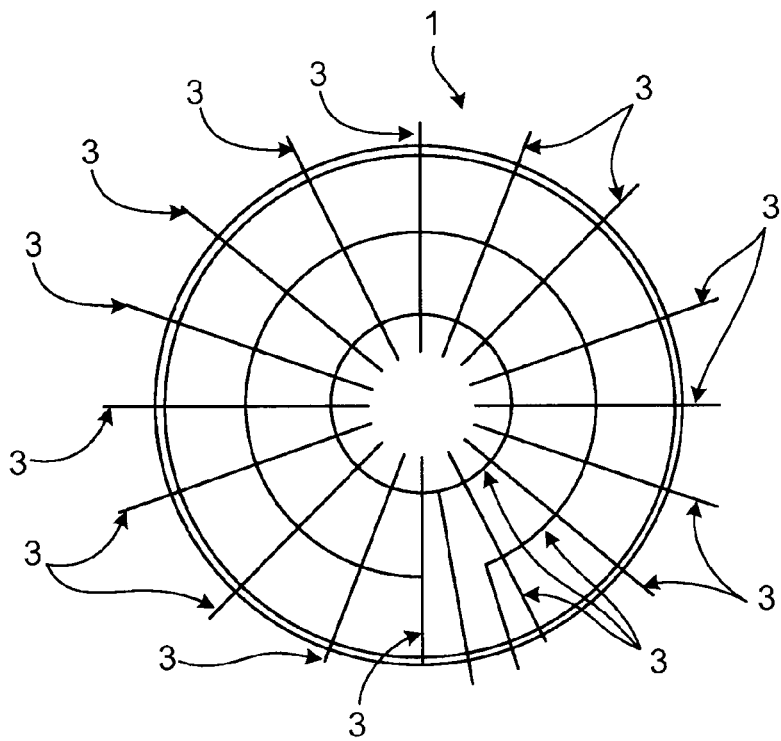
Figure 11B:
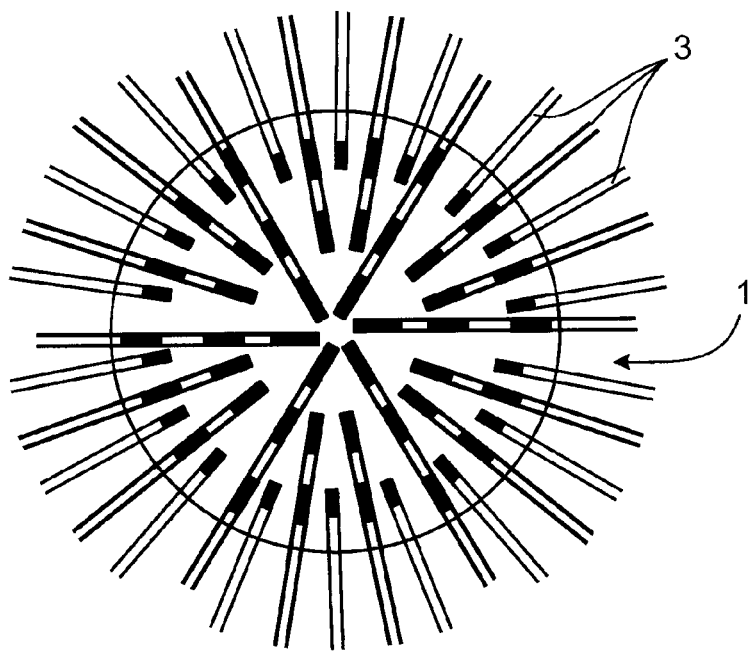
Figure 12:
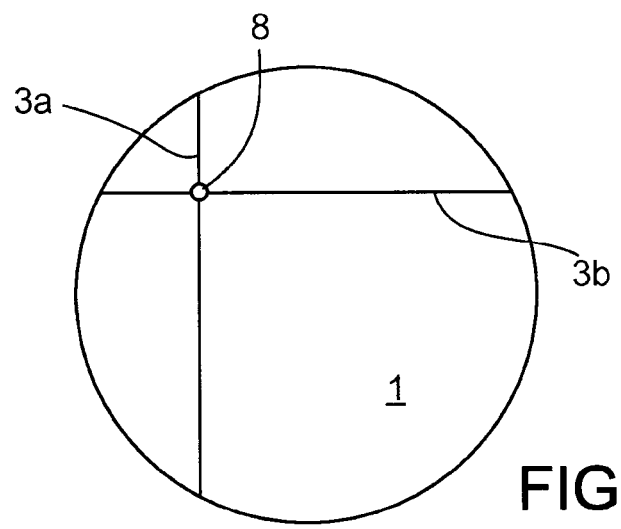
Figure 13:
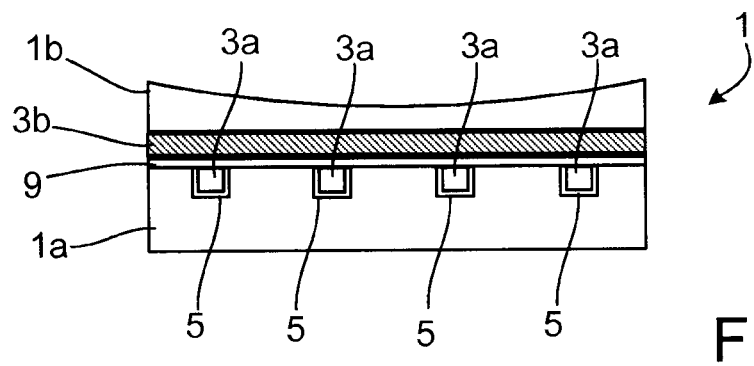
Figure 14:
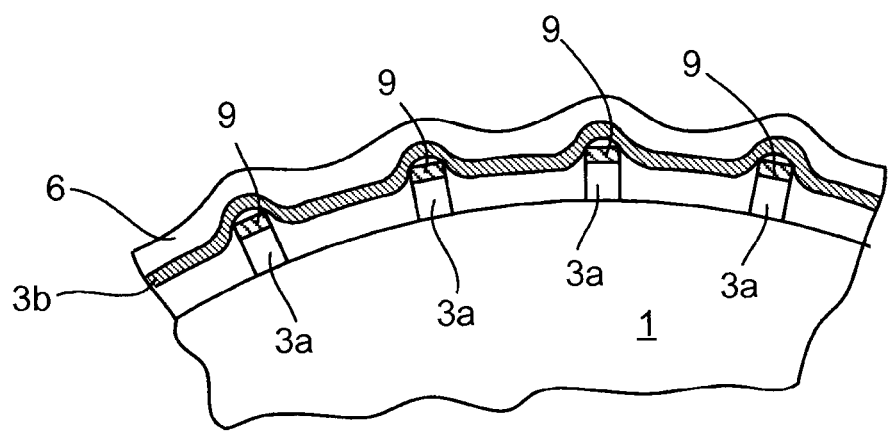
Figure 15:
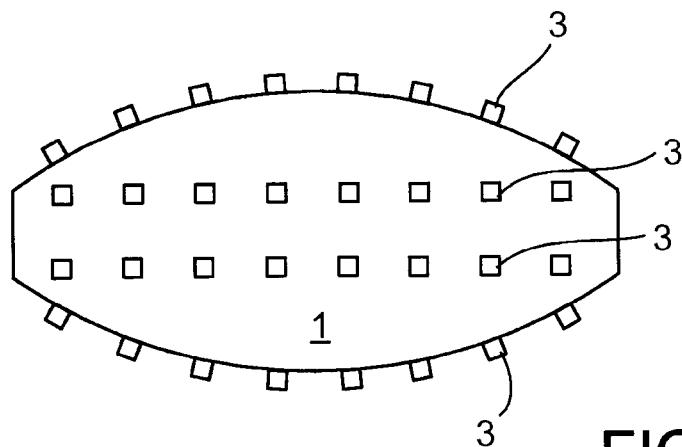
Figure 16:
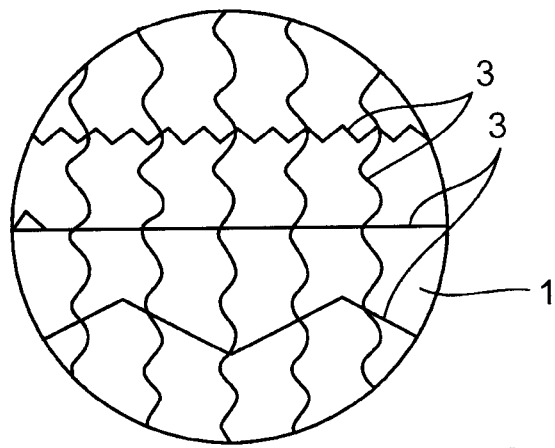
Figure 17:
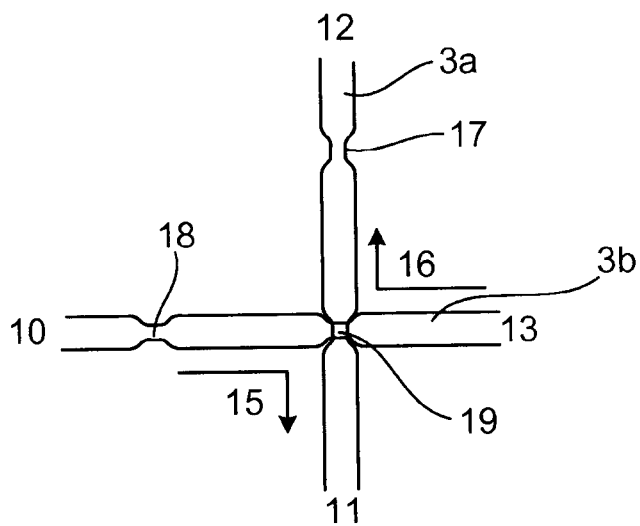
Figure 18:
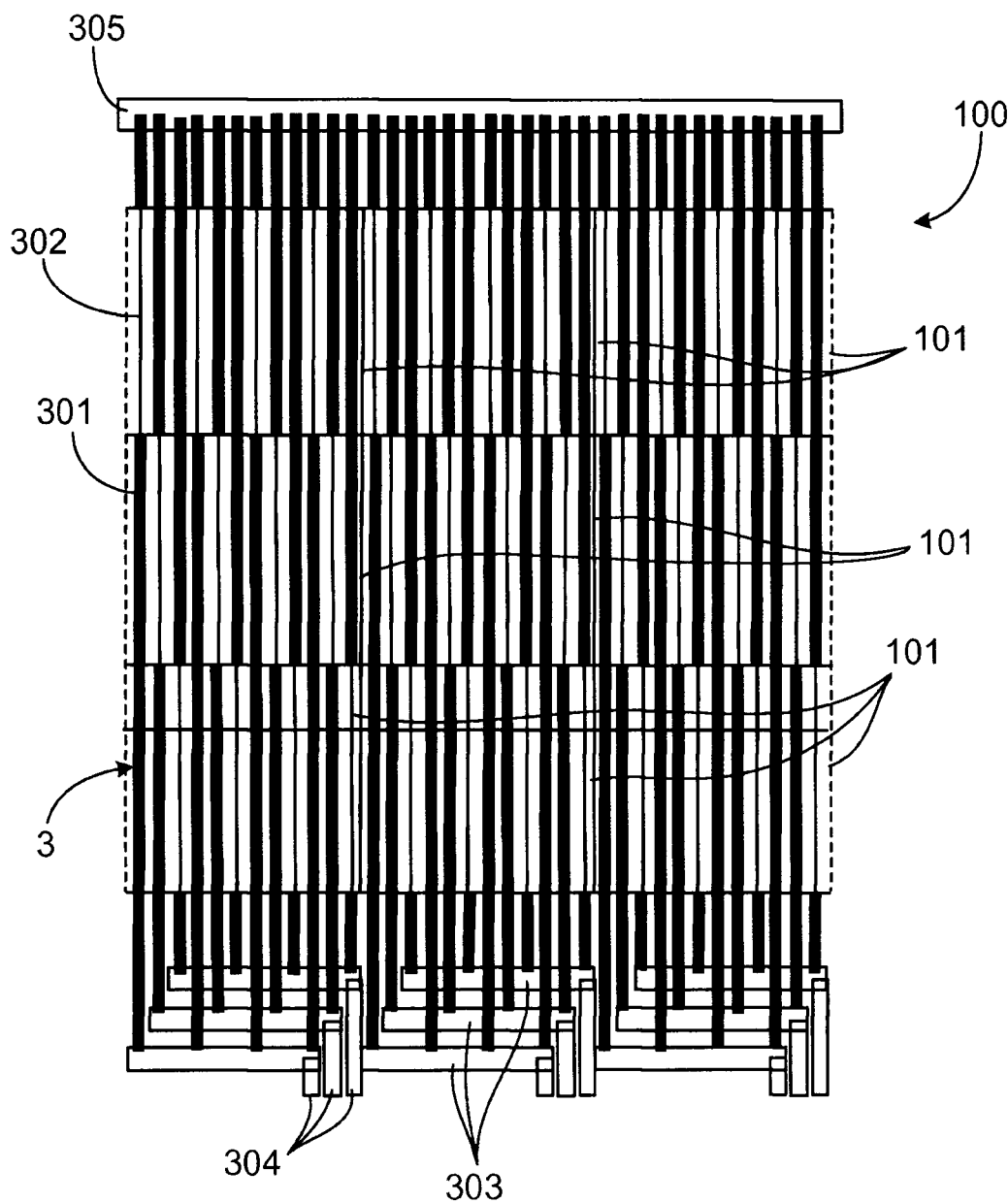
Figure 19:
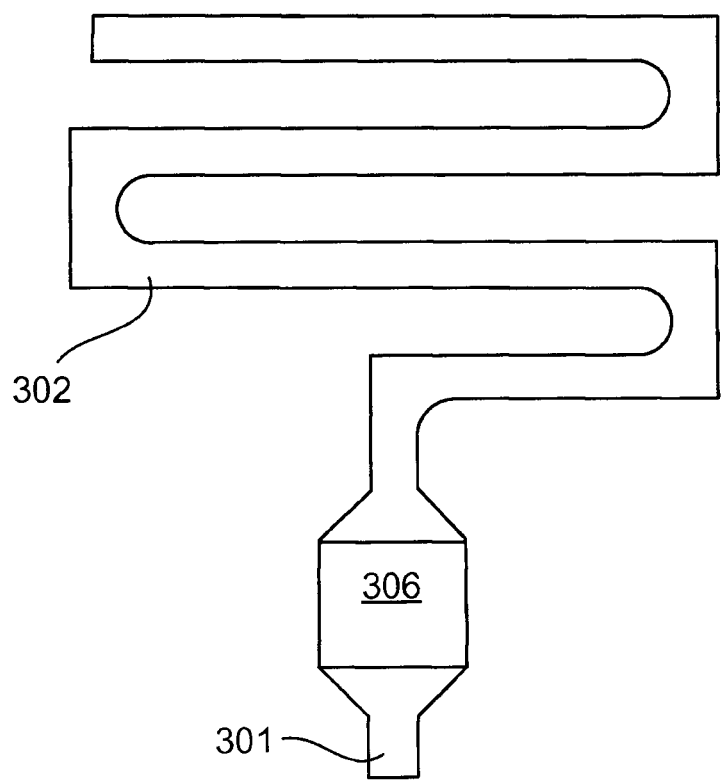
Figure 20:
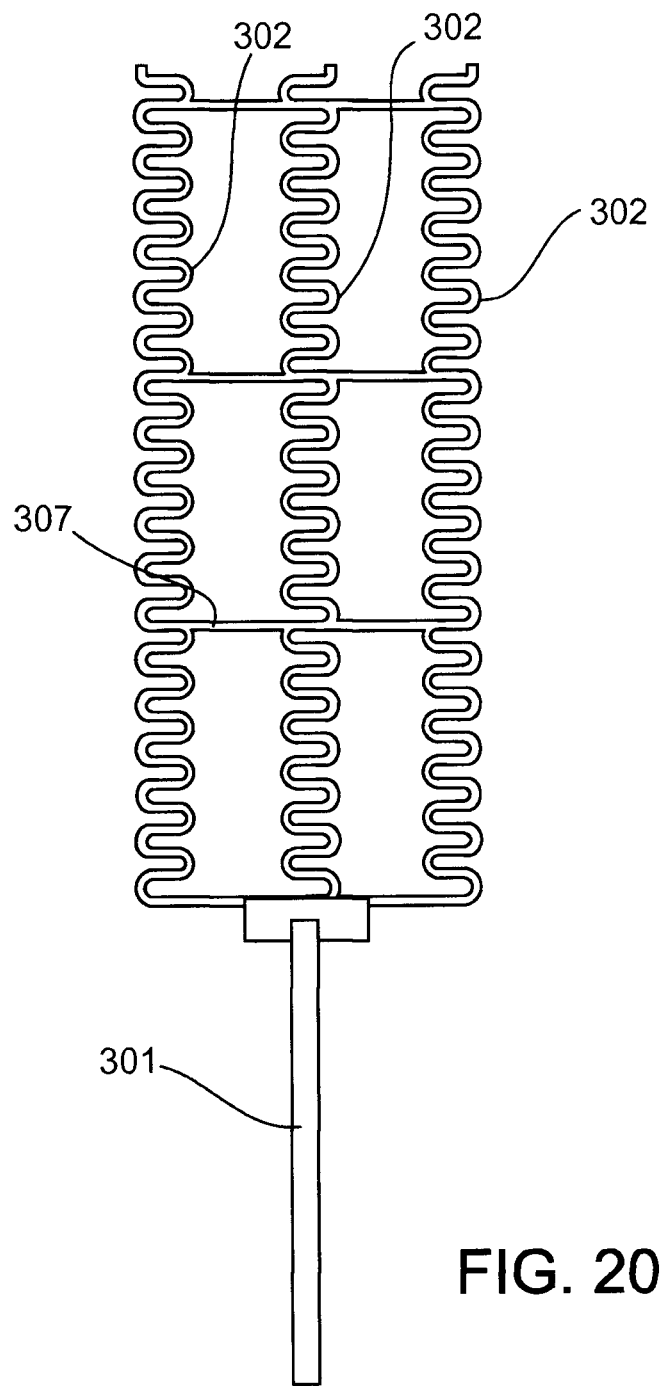
Figure 21:
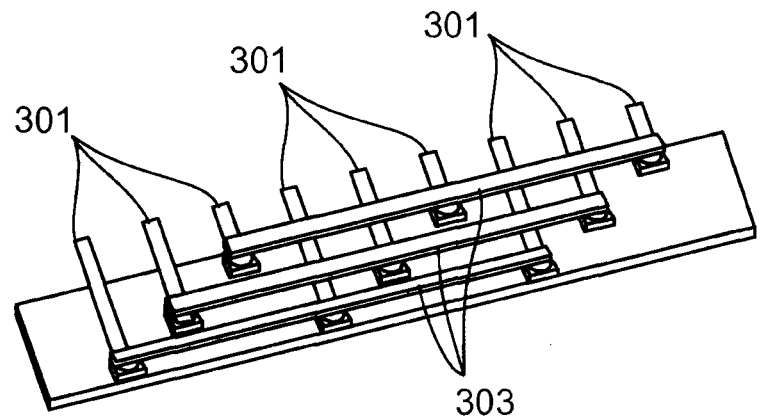
Figure 22:
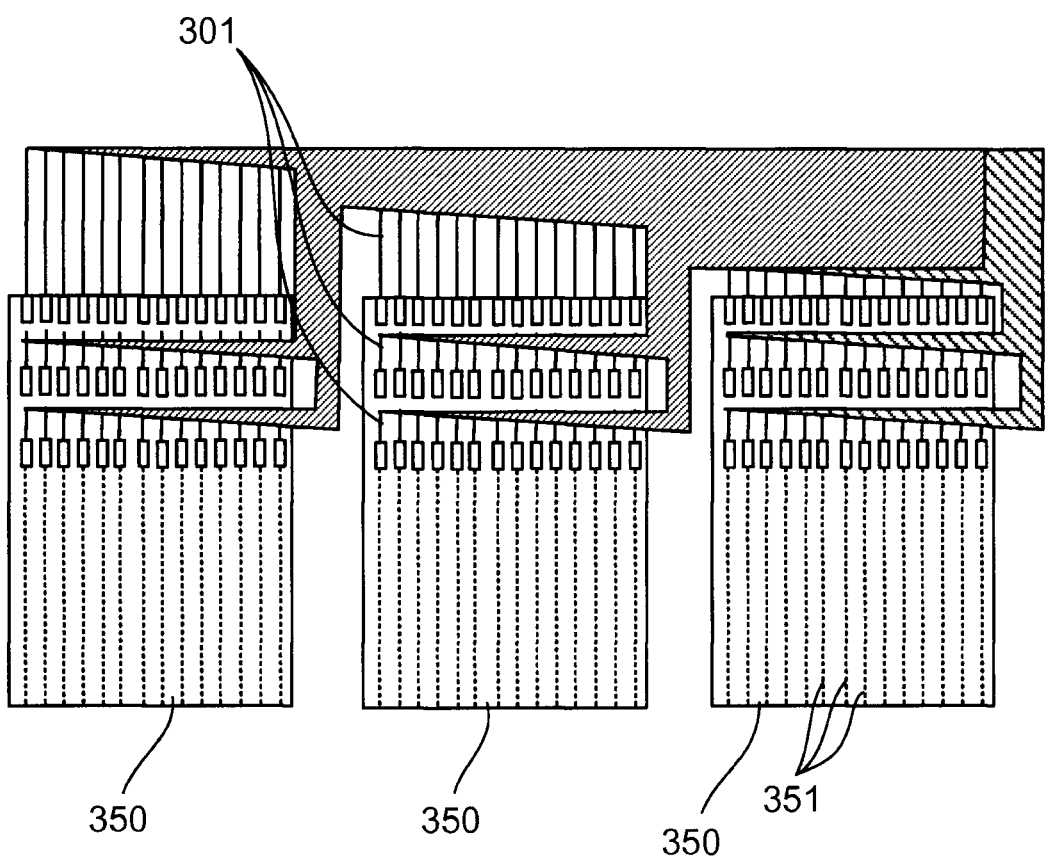
Figure 23:
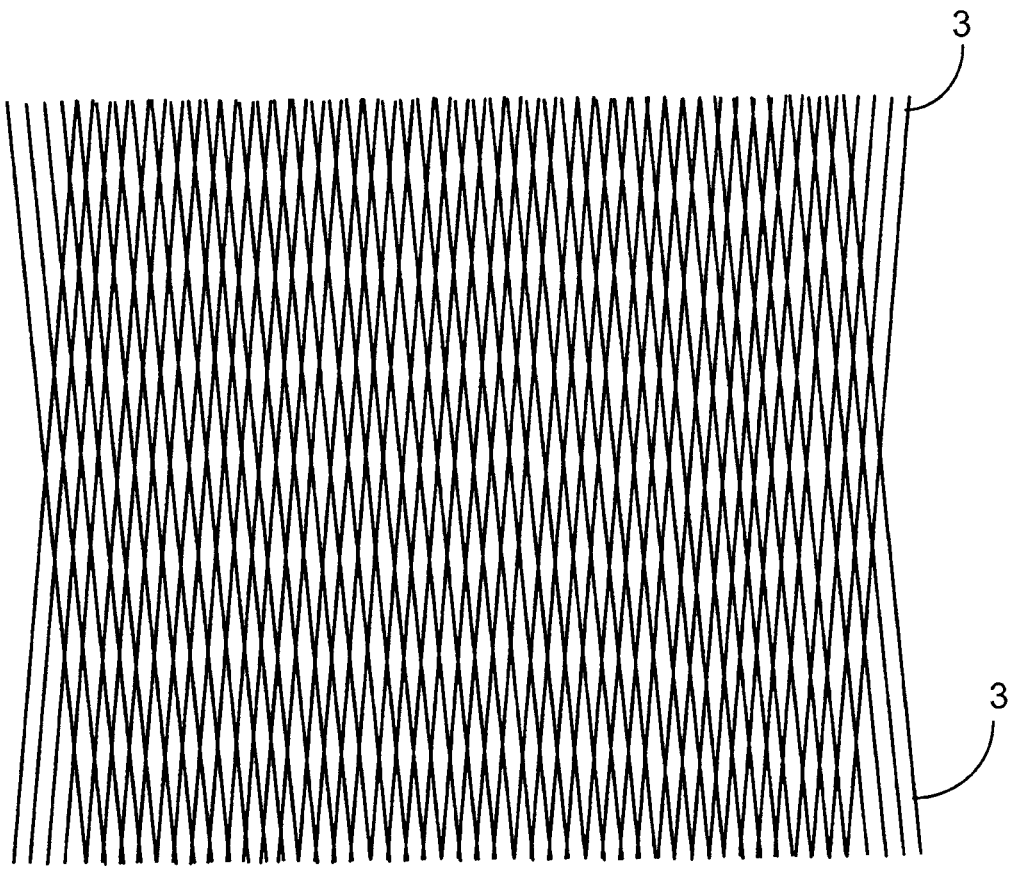
Figure 25:
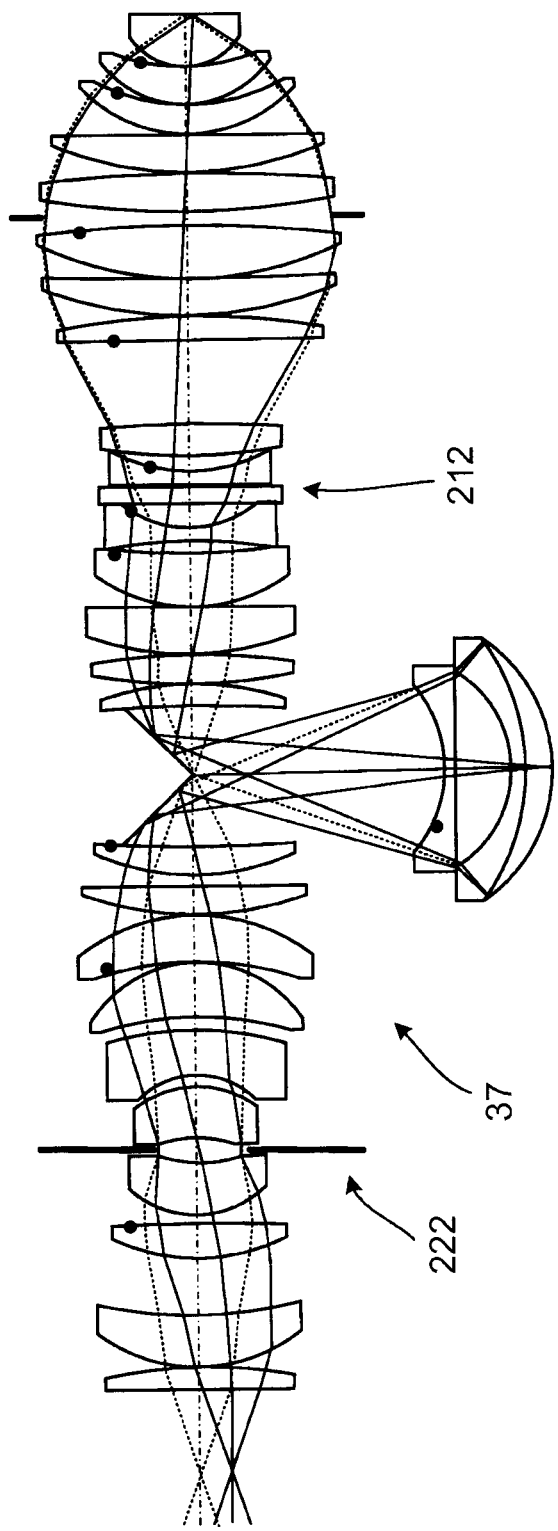
Figure 26:
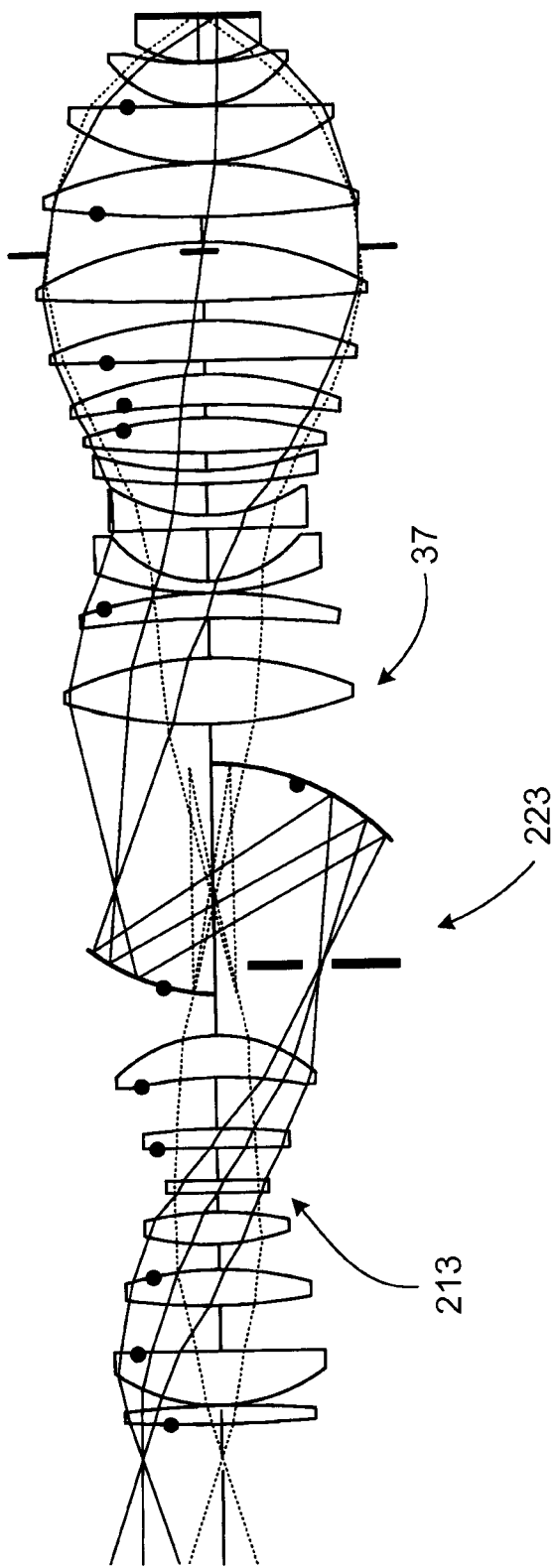
Figure 27:
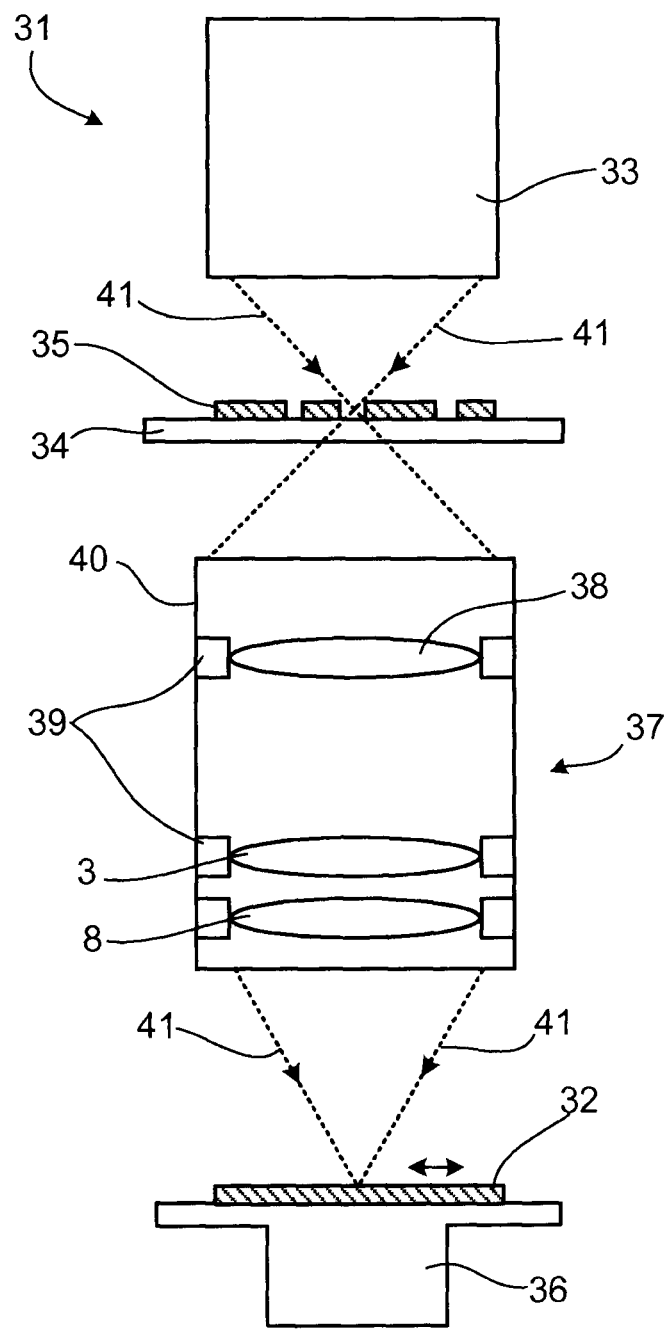

FIG. 27 illustrates a projection exposure apparatus 31 for semiconductor lithography, into which the described optical elements are integrated. This serves for exposing structures onto a substrate coated with photosensitive materials, which substrate is generally composed predominantly of silicon and designated as wafer 32, for producing semiconductor components, such as e.g. computer chips.

In this case, the projection exposure apparatus 31 essentially includes an illumination device 33, a device 34 for receiving and exactly positioning a mask provided with a structure, a so-called reticle 35, which determines the later structures on the wafer 32, a device 36 for mounting, moving and exactly positioning precisely the wafer 32, and an imaging device, namely a projection objective 37, including a plurality of optical elements 38 which are mounted in an objective housing 40 of the projection objective 37 via holders 39. In this case, an optical element 1 can be arranged at any desired location in the projection objective 37 or else in the illumination device 33.

In this case, the basic functional principle provides for the structures introduced into the reticle 35 to be imaged onto the wafer 32; the imaging is generally performed in demagnifying fashion.

After exposure has been effected, the wafer 32 is moved further in the arrow direction, such that a multiplicity of individual fields, each having the structure prescribed by the reticle 35, are exposed on the same wafer 32. In this case, the exposure process itself can be carried out during a relative rest position of wafer and reticle with respect to one another (wafer stepper) or during a relative movement of wafer and reticle (wafer scanner).

The illumination device 33 provides a projection beam 41 desired for the imaging of the reticle 35 on the wafer 32, for example light or a similar electromagnetic radiation. A laser or the like can be used as a source for this radiation. The radiation is shaped in the illumination device 33 via optical elements in such a way that the projection beam 41, upon impinging on the reticle 35, has the desired properties: polarization, homogeneous field illumination ("uniformity") or intensity profile, telecentricity, shading at the field edge, application-specific pupil filling (dipole, quadrupole, annular) with desired symmetry properties.

Via the beams 41, an image of the reticle 35 is generated and transferred to the wafer 32 in correspondingly demagnified fashion by the projection objective 37, as has already been explained above. The projection objective 37 has a multiplicity of individual refractive, diffractive and/or reflective optical elements 38 such as e.g. lenses, mirrors, prisms, terminating plates and the like.

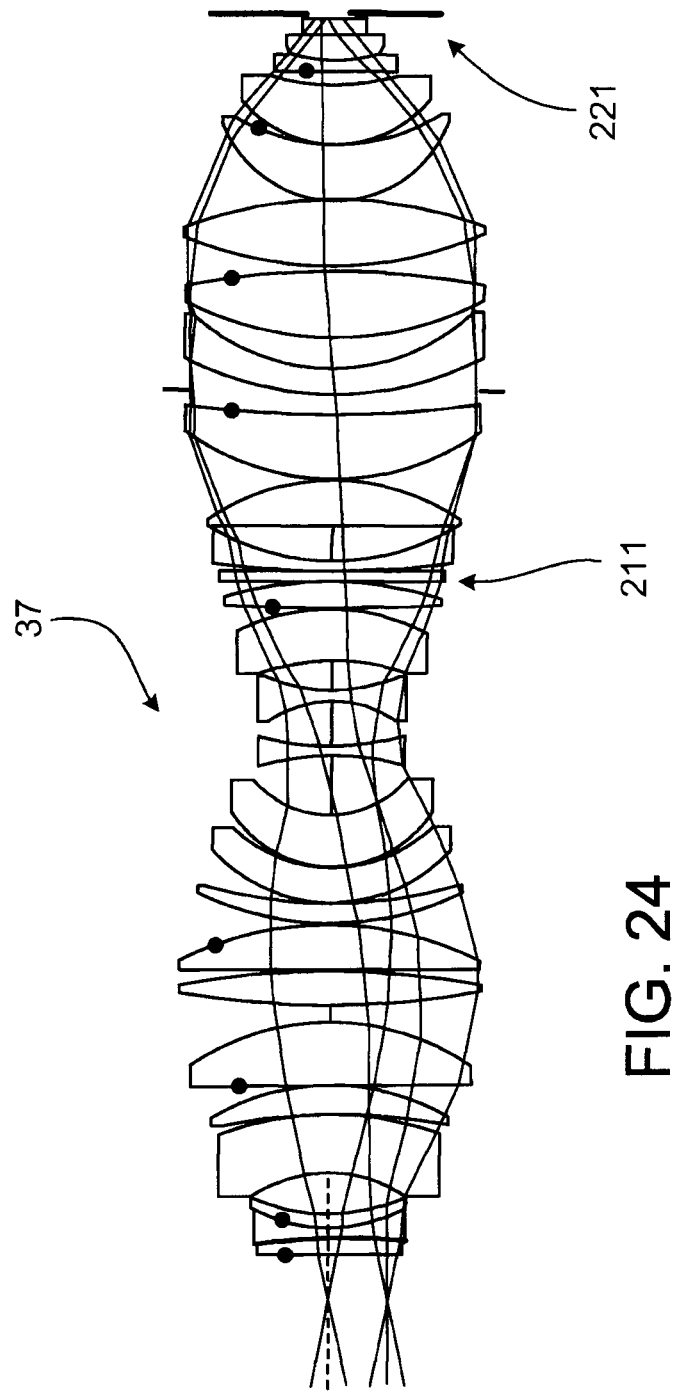

What is claimed is:

1. A projection objective configured to image a reticle onto a wafer along a path of optical radiation, the projection objective comprising:
    a plane parallel plate including electrical conductor tracks at a region of the plane parallel plate; and
    a voltage supply electrically coupled to at least some of the electrical conductor tracks,
    wherein:
        the region of the plane parallel plate has a portion that is transmissive to the optical radiation and that comprises at least one portion of the electrical conductor tracks;
        during use of the projection objective, the plane parallel plate is in the path of the optical radiation so that the optical radiation is incident on the region of the plane parallel plate;
        during use of the projection objective, at least some of the electrical conductor tracks diffract the optical radiation;
        at least some regions of the electrical conductor tracks have a diameter of at most 50 micrometers in a direction lateral to a direction of incidence of the optical radiation on the plane parallel plate; and
        the projection objective is a microlithography projection objective.

2. The projection objective as claimed in claim 1, wherein, during use of the projection objective, the plane parallel plate at least partially spatially resolves correction of a wavefront aberration of the projection objective.

3. The projection objective as claimed in claim 1, wherein the width of the at least some regions of the electrical conductor tracks is at most 1 micrometer in the direction lateral to the direction of incidence of the optical radiation.

4. The projection objective as claimed in claim 2, further comprising a further optical element, wherein the wavefront aberration comprises an imaging aberration which can be caused by compaction and/or rarefaction of the further optical element.

5. The projection objective as claimed in claim 1, wherein the electrical conductor tracks are arranged in a matrix in a propagation direction of the optical radiation in a plan view of the plane parallel plate.

6. The projection objective as claimed in claim 1, wherein the electrical conductor tracks are arranged radially in star-shaped fashion or rotationally symmetrically in the propagation direction of the optical radiation in a plan view of the plane parallel plate.

7. The projection objective as claimed in claim 1, further comprising:
   a control computer; and
   wavefront sensors.

* * * * *

UNITED STATES PATENT AND TRADEMARK OFFICE
CERTIFICATE OF CORRECTION

| | |
|---|---|
| PATENT NO. | : 8,891,172 B2 |
| APPLICATION NO. | : 12/402015 |
| DATED | : November 18, 2014 |
| INVENTOR(S) | : Eva et al. |

It is certified that error appears in the above-identified patent and that said Letters Patent is hereby corrected as shown below:

The title page showing the illustrative figure should be deleted to be replaced with the attached title page.

Title Page, Col. 1, line 5, under "Inventors:" delete "Bartholomac" and insert --Bartholoma--.

In the Drawings

In the drawing sheets, consisting of Figs. 1-17, should be deleted to be replaced with the drawing sheets, consisting of Figs. 1-17, as shown on the attached pages.

In the Specification

Col. 4, line 67, delete "disclosure" and insert --disclosure--;

Col. 5, line 2, delete "element" and insert --element;--.

Col. 12, line 7, delete "resisitivities" and insert --resistivities--.

Col. 13, line 61, delete "aniosotropically" and insert --anisotropically--.

Col. 14, line 53, delete "element" and insert --element.--.

Col. 14, line 54, delete "action" and insert --action.--.

Col. 15, line 34, delete "such sa" and insert --such as--.

Col. 16, line 37, delete "interoferometrically" and insert --interferometrically--.

Signed and Sealed this
Eighth Day of September, 2015

Michelle K. Lee
*Director of the United States Patent and Trademark Office*

(12) United States Patent
Eva et al.

(10) Patent No.: US 8,891,172 B2
(45) Date of Patent: Nov. 18, 2014

(54) OPTICAL ELEMENT AND METHOD

(75) Inventors: Eric Eva, Aalen (DE); Payam Tayebati, Ulm (DE); Michael Thier, Moegglingen (DE); Markus Hauf, Ulm (DE); Ulrich Schoenhoff, Ulm (DE); Ole Fluegge, Bartholomac (DE); Arif Kazi, Aalen (DE); Alexander Sauerhoefer, Hamburg (DE); Gerhard Focht, Wilmsdorf (DE); Jochen Weber, Heidenheim-Grosskuchen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/402,015

(22) Filed: Mar. 11, 2009

(65) Prior Publication Data
US 2009/0257032 A1 Oct. 15, 2009

Related U.S. Application Data

(63) Continuation of application No. PCT/EP2007/008266, filed on Sep. 21, 2007.

(30) Foreign Application Priority Data

Sep. 21, 2006 (DE) .................. 10 2006 045 075

(51) Int. Cl.
| G02B 9/00 | (2006.01) |
| G03F 7/20 | (2006.01) |
| G02B 27/00 | (2006.01) |
| G02B 7/02 | (2006.01) |

(52) U.S. Cl.
CPC ........ *G03F 7/70891* (2013.01); *G02B 27/0068* (2013.01); *G03F 7/70266* (2013.01); *G02B 7/028* (2013.01)
USPC ................................ 359/649

(58) Field of Classification Search
USPC ................................ 359/649–651
See application file for complete search history.

(56) References Cited

U.S. PATENT DOCUMENTS

| 3,904,274 | A |   | 9/1975 | Feinleib et al |         |
|-----------|---|---|--------|----------------|---------|
| 4,730,900 | A |   | 3/1988 | Uehara et al   |         |
| 4,773,748 | A |   | 9/1988 | Shih et al.    |         |
| 4,784,476 | A | * | 11/1988| Schulman et al.| 359/245 |
| 4,848,881 | A |   | 7/1989 | Kahan et al    |         |

(Continued)

FOREIGN PATENT DOCUMENTS

| DE | 40 42 259  | 6/1992  |
| DE | 198 24 030 | 12/1999 |

(Continued)

OTHER PUBLICATIONS

Hecht, Eugene. Optics, second edition, sections 10.1 and 10.1.1, May 1990.*

(Continued)

*Primary Examiner* — Jordan Schwartz
(74) *Attorney, Agent, or Firm* — Fish & Richardson P.C.

(57) ABSTRACT

The disclosure relates to an optical element configure to at least partial spatially resolve correction of a wavefront aberration of an optical system (e.g., a projection exposure apparatus for microlithography) to which optical radiation can be applied, as well as related systems and methods.

7 Claims, 17 Drawing Sheets

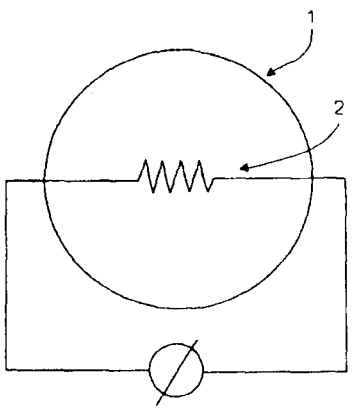

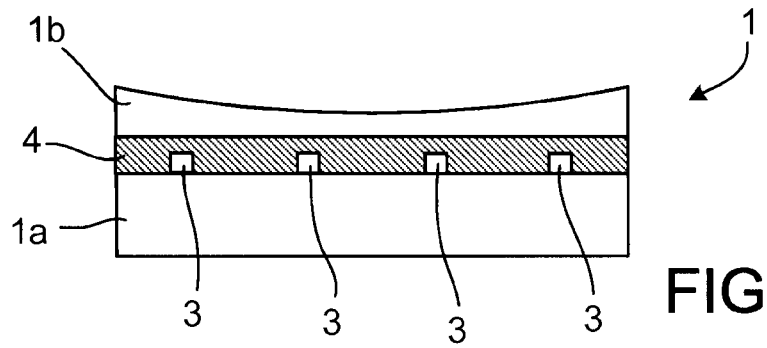
FIG. 3
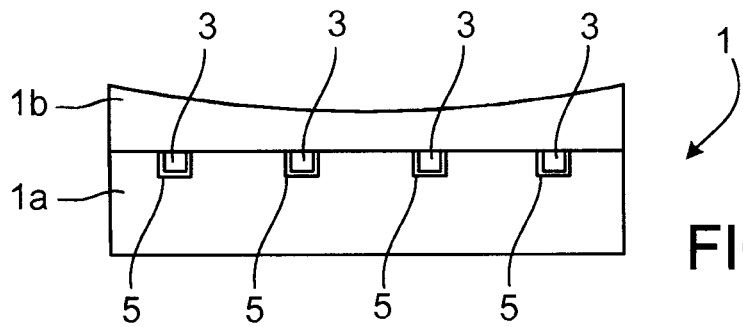
FIG. 4
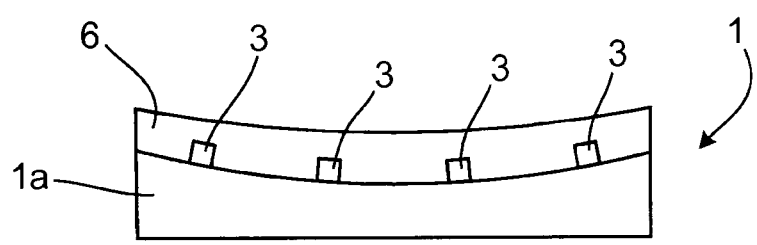
FIG. 5
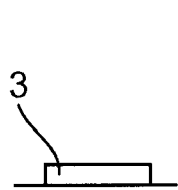   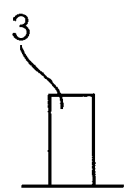   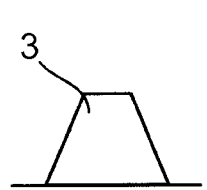   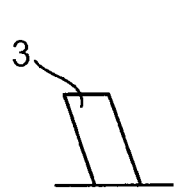
FIG. 6A     FIG. 6B     FIG. 6C     FIG. 6D